United States Patent
Kadatskyy et al.

(10) Patent No.: US 6,341,076 B1
(45) Date of Patent: Jan. 22, 2002

(54) LOSS REDUCTION CIRCUIT FOR SWITCHING POWER CONVERTERS

(75) Inventors: Anatoly F. Kadatskyy; Yevgen V. Karpov; Vyacheslav Y. Soynikov; Naum I. Volovets, all of South San Francisco, CA (US)

(73) Assignee: Next Power Corporation, South San Francisco, CA (US)

( * ) Notice: Subject to any disclaimer, the term of this patent is extended or adjusted under 35 U.S.C. 154(b) by 0 days.

(21) Appl. No.: 09/677,717

(22) Filed: Sep. 30, 2000

Related U.S. Application Data

(63) Continuation-in-part of application No. 09/578,180, filed on May 23, 2000.

(51) Int. Cl.[7] .............................................. H02H 7/122
(52) U.S. Cl. .................. 363/56.12; 363/56.09
(58) Field of Search ................ 363/20, 21.01, 363/55, 56.06, 56.09, 56.12, 131; 323/220, 222, 223, 224

(56) References Cited

U.S. PATENT DOCUMENTS

| | | | |
|---|---|---|---|
| 4,857,822 A | 8/1989 | Tabisz et al. | |
| 5,208,902 A | 5/1993 | Kumon | |
| 5,293,111 A | 3/1994 | Weingberg | |
| 5,307,005 A | 4/1994 | Ahladas et al. | |
| 5,414,613 A | * 5/1995 | Chen | 363/52 |
| 5,418,704 A | 5/1995 | Hua et al. | |
| 5,434,767 A | * 7/1995 | Batarseh et al. | 363/16 |
| 5,550,458 A | 8/1996 | Farrington et al. | |
| 5,636,114 A | 6/1997 | Bhagwat et al. | |
| 5,736,842 A | 4/1998 | Jovanovic | |
| 5,742,495 A | 4/1998 | Barone | |
| 5,781,419 A | * 7/1998 | Kutkut et al. | 363/17 |
| 5,793,190 A | 8/1998 | Sahlstrom et al. | |
| 5,793,626 A | 8/1998 | Jiang | |
| 5,828,559 A | 10/1998 | Chen | |
| 5,841,268 A | 11/1998 | Mednik | |
| 5,875,103 A | * 2/1999 | Bhagwat et al. | 363/17 |
| 5,898,581 A | 4/1999 | Liu | |
| 5,914,587 A | 6/1999 | Liu | |
| 5,923,152 A | 7/1999 | Guerrera | |
| 5,923,153 A | 7/1999 | Liu | |
| 5,959,438 A | 9/1999 | Jovanovic et al. | |
| 5,977,754 A | 11/1999 | Cross | |
| 5,991,174 A | 11/1999 | Farrington et al. | |
| 6,008,630 A | 12/1999 | Prasad | |
| 6,021,052 A | * 2/2000 | Unger et al. | 363/26 |
| 6,028,418 A | 2/2000 | Jovanovic et al. | |
| 6,051,961 A | 4/2000 | Jang et al. | |
| 6,051,963 A | 4/2000 | Eagar | |
| 6,060,867 A | 5/2000 | Farrington et al. | |
| 6,166,500 A | * 12/2000 | Makaran | 318/254 |
| 6,236,191 B1 | * 5/2001 | Chaffai | 323/225 |

\* cited by examiner

*Primary Examiner*—Adolf Deneke Berhane
(74) *Attorney, Agent, or Firm*—Ray K. Shahani, Esq.

(57) ABSTRACT

A DC-DC power converter, and, more specifically, an active snubber circuit, method of operation thereof and power converter employing the same, and more specifically, a pulse width modulated DC-DC power converter which processes power from an input DC voltage source and delivers power to a load through an inductive energy storage component being alternatively connected to the input DC power source and to the load via electronic solid state switches.

12 Claims, 26 Drawing Sheets

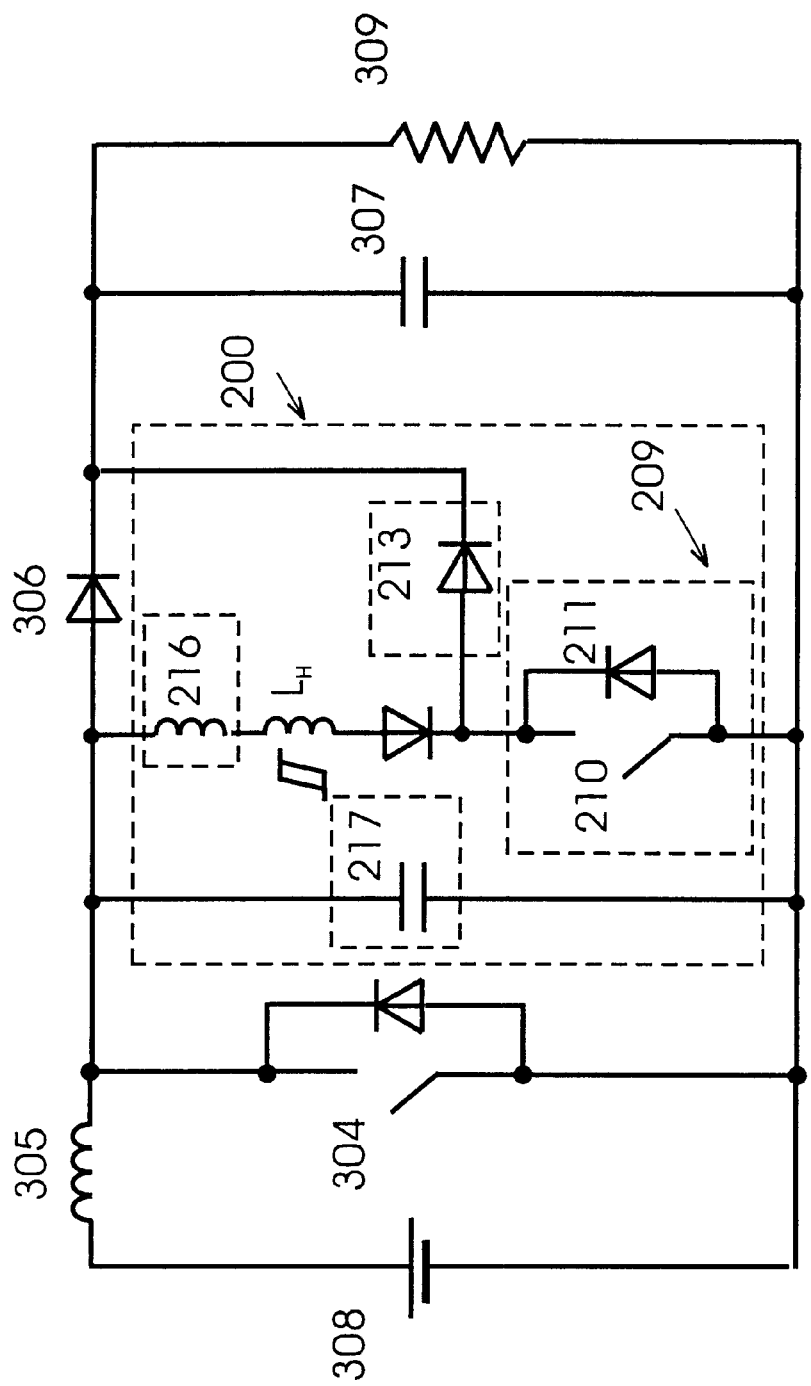
FIG. 1 (a) PRIOR ART

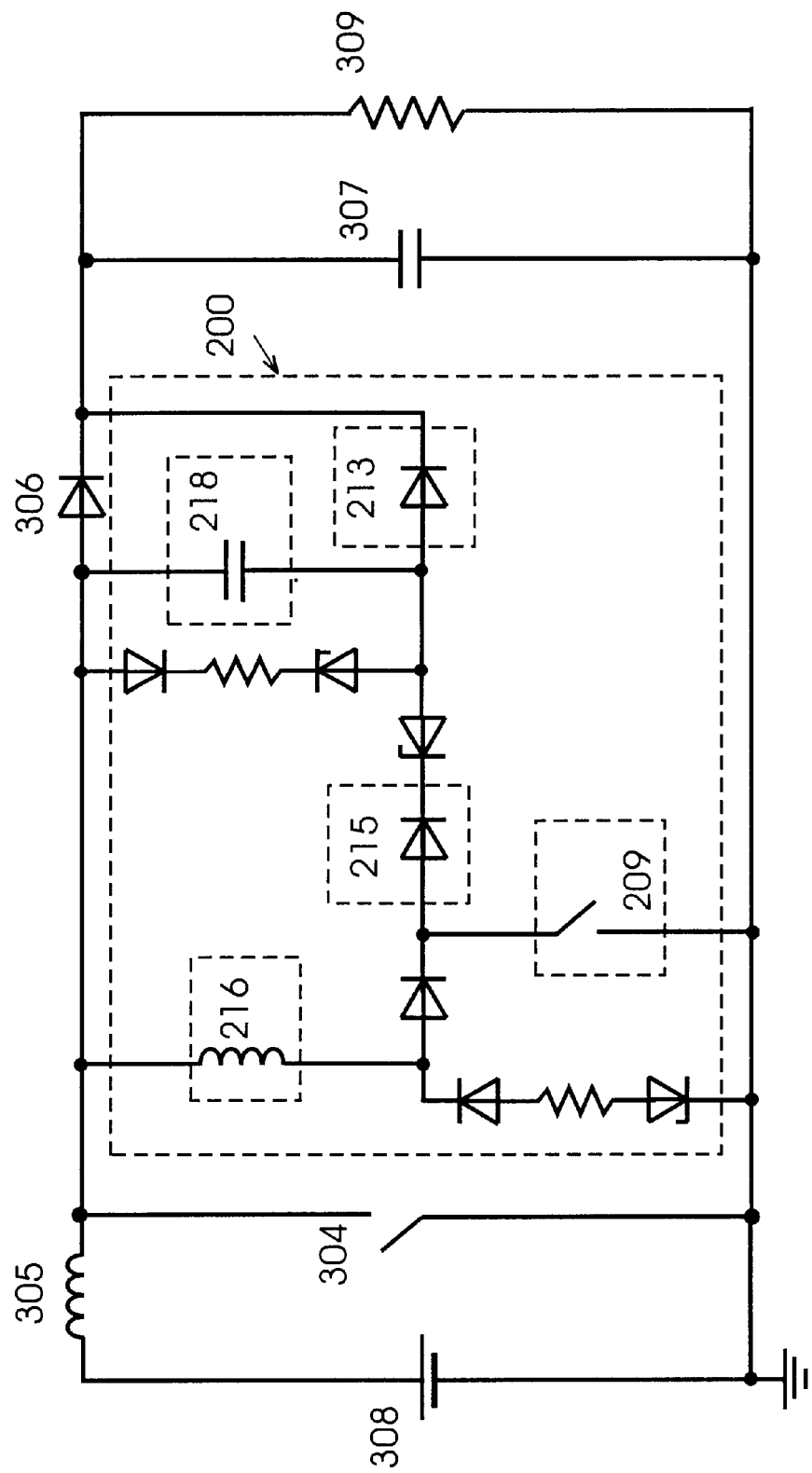
FIG. 1 (b) PRIOR ART

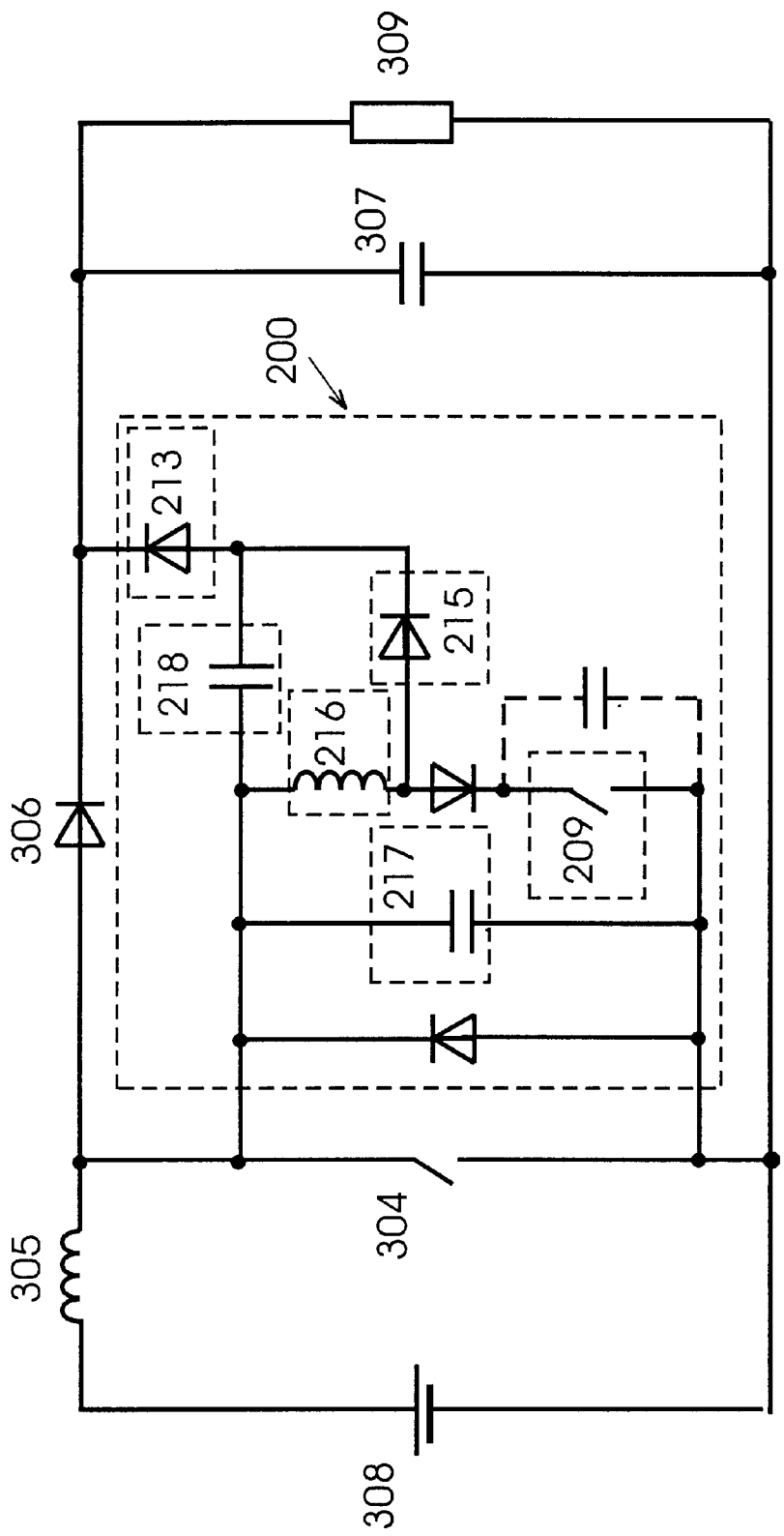
FIG. 1 (c) PRIOR ART

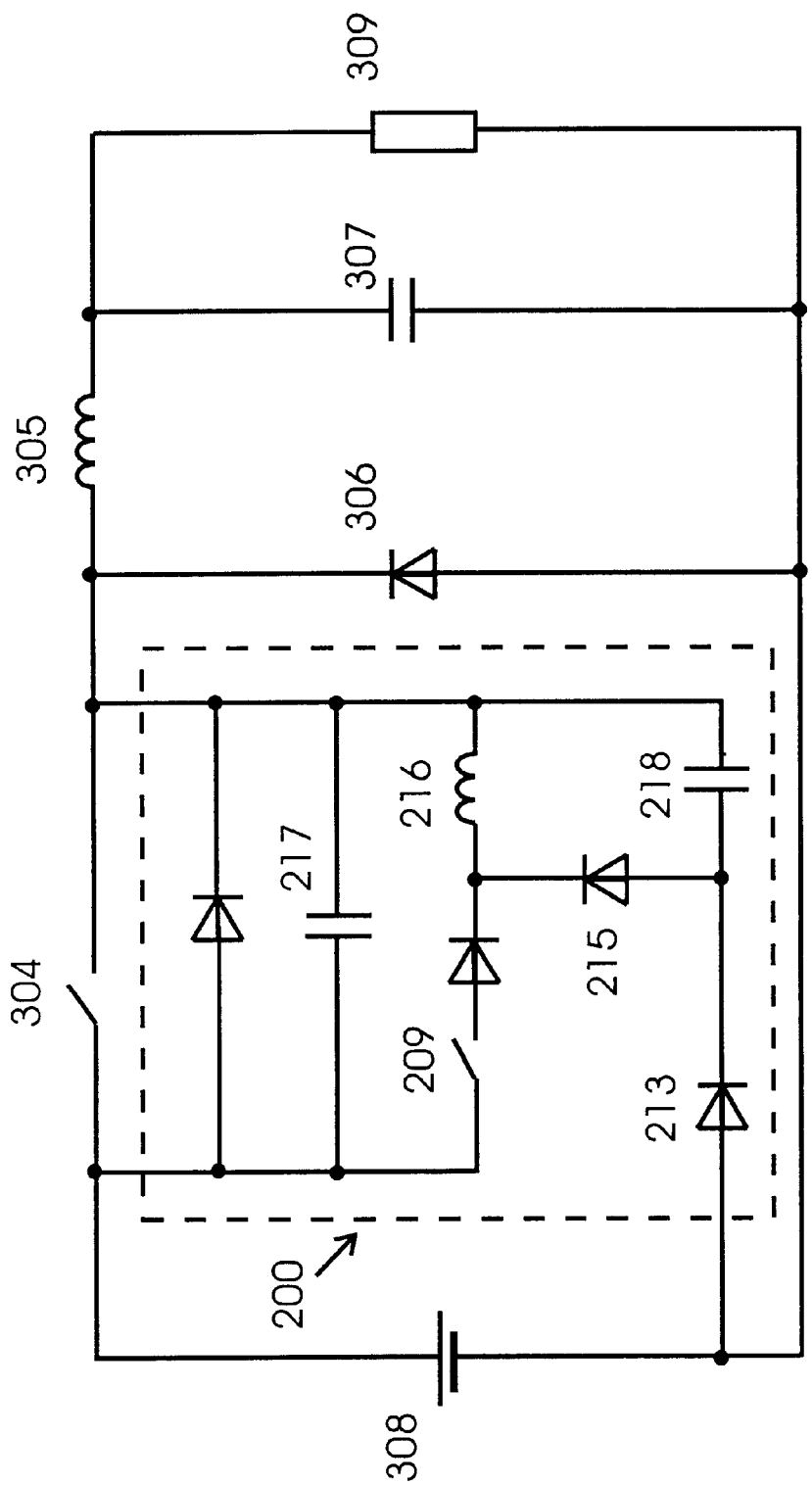
FIG. 1 (d) PRIOR ART

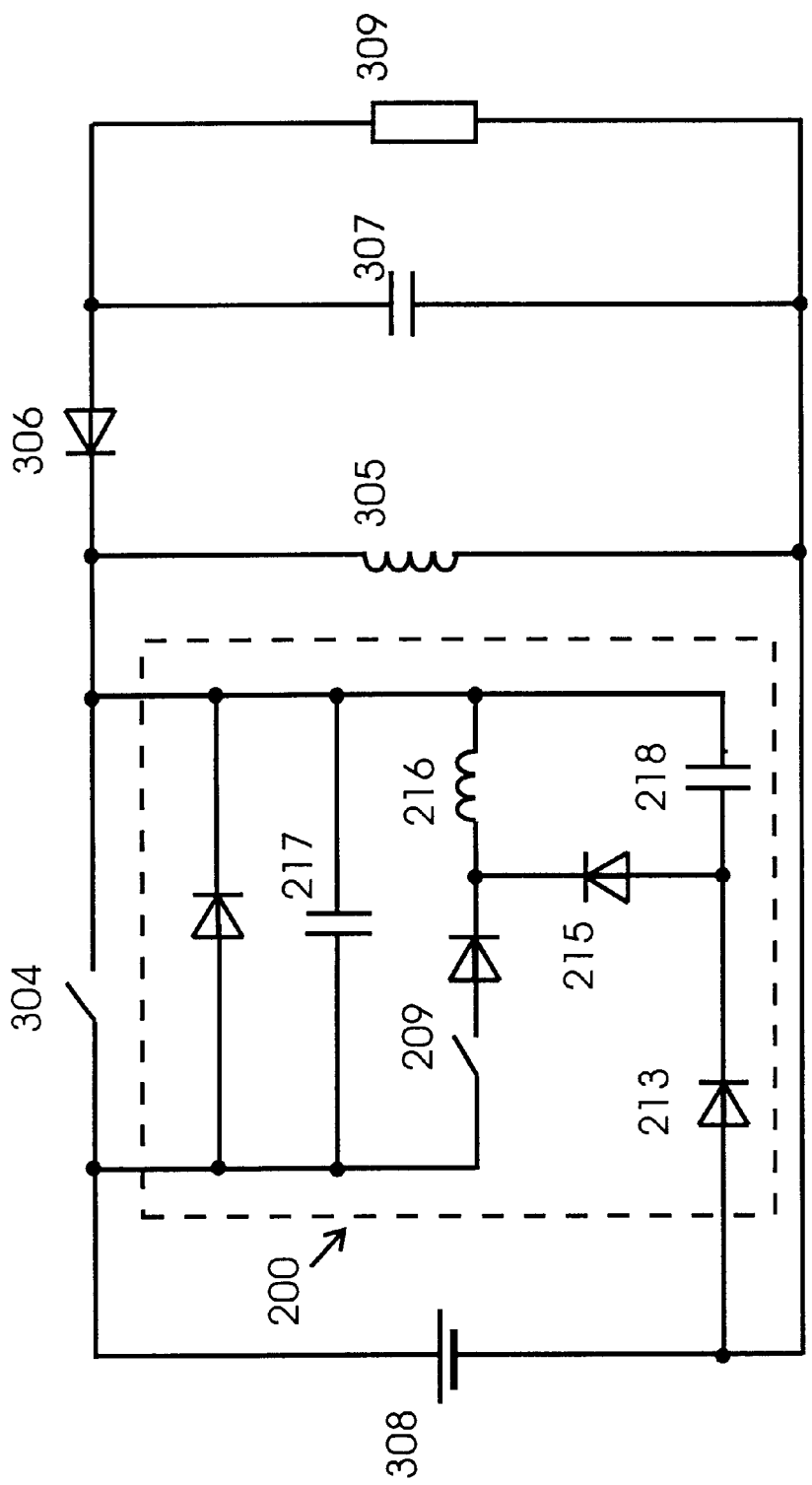
FIG. 1 (e) PRIOR ART

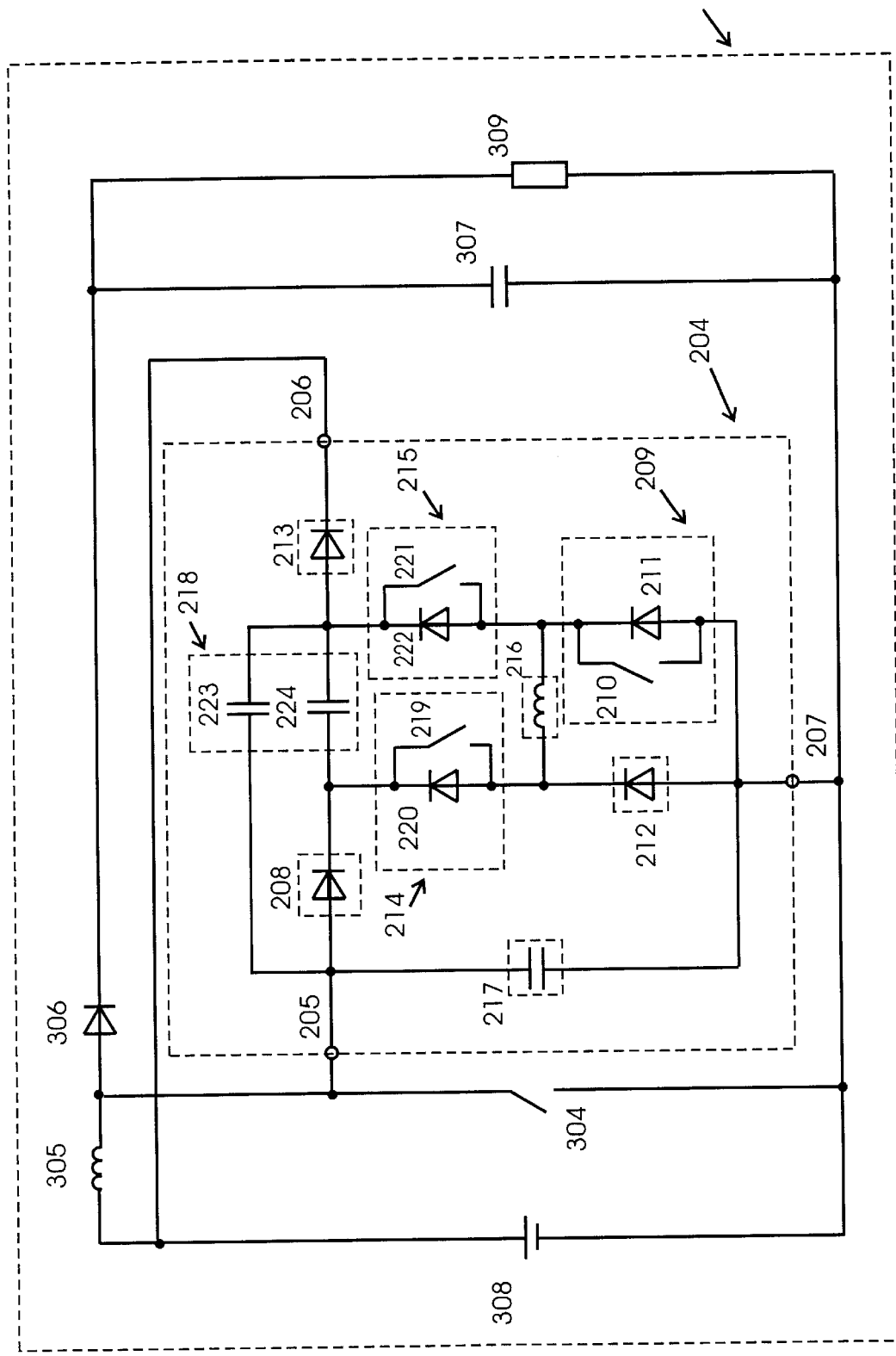
FIG. 3, b

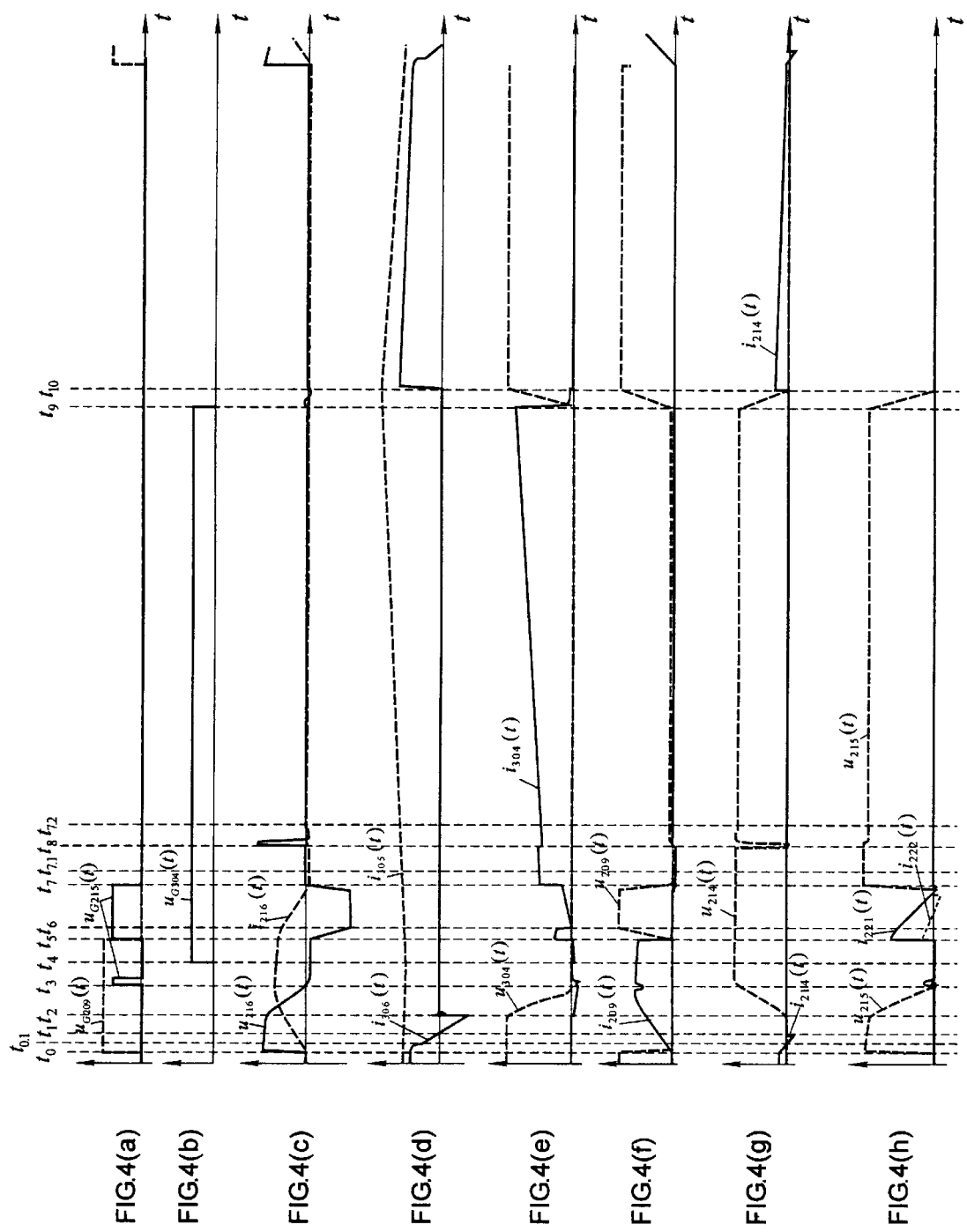

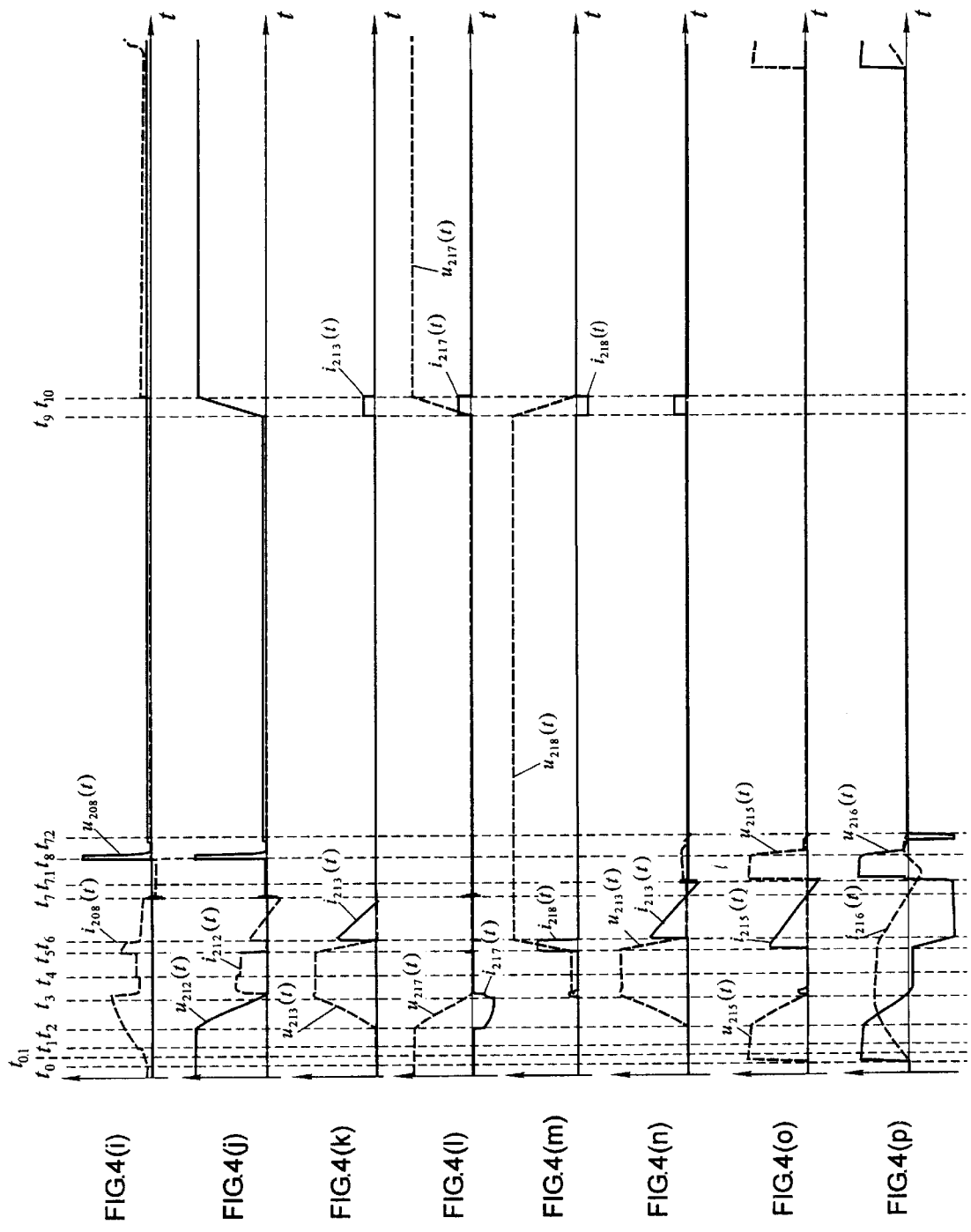

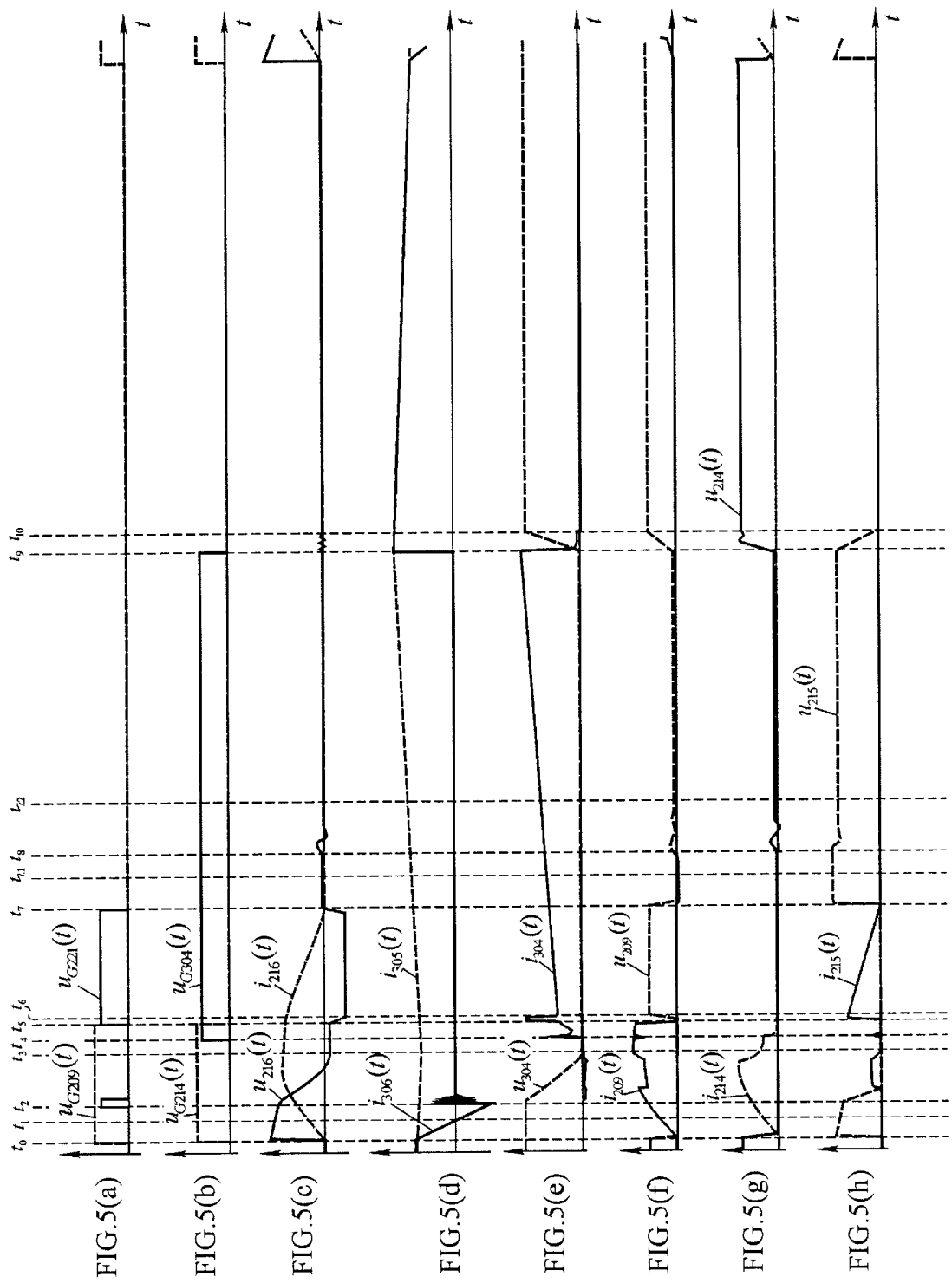

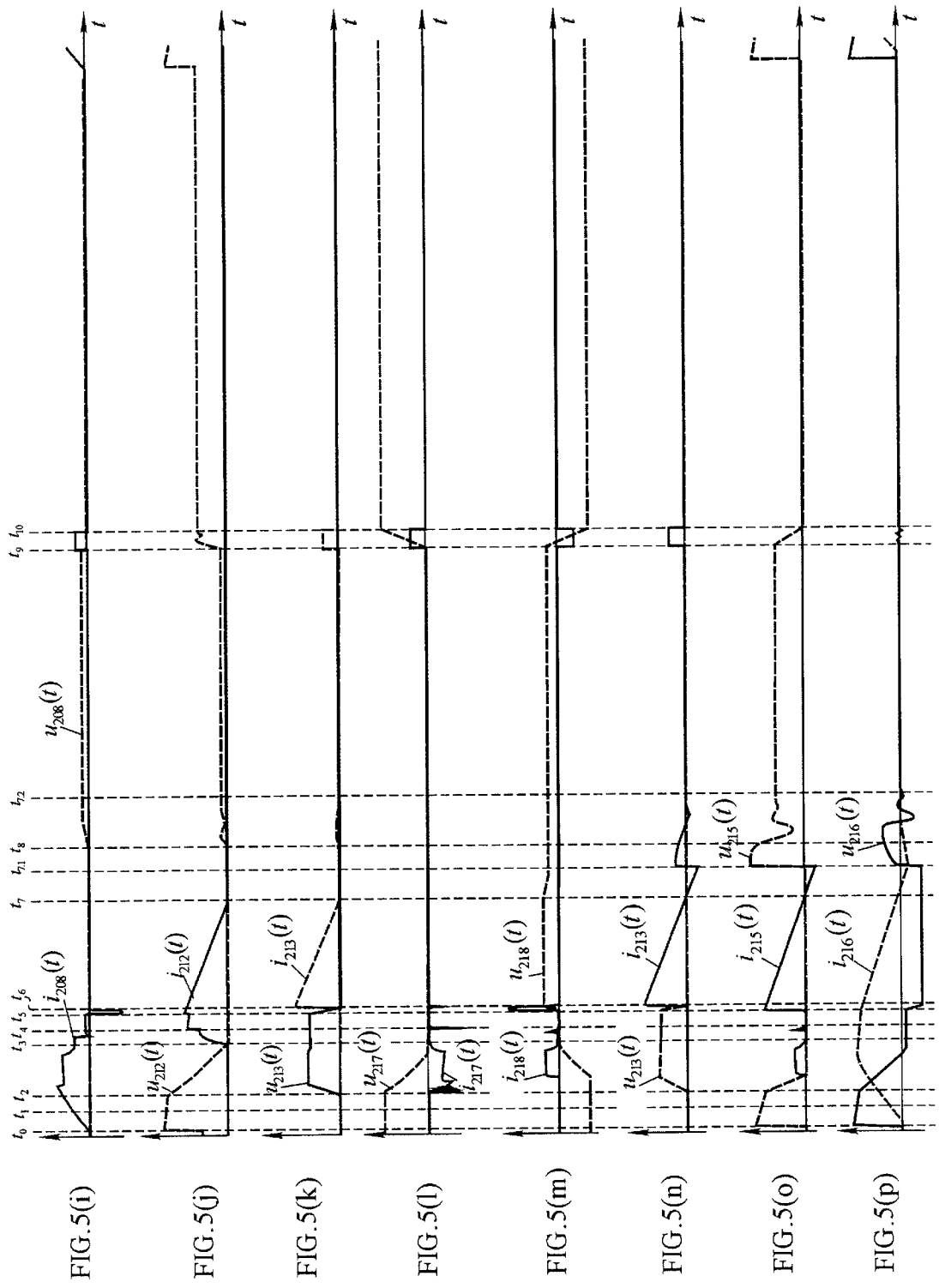

LOSS REDUCTION CIRCUIT FOR SWITCHING POWER CONVERTERS

RELATED APPLICATIONS AND/OR PRIORITY CLAIMS

This application is continuation-in-part and incorporates herein in its entirety U.S. patent application Ser. No. 09/578, 180 filed May 23, 2000, entitled METHOD FOR CLUSTERIZED POWER SHARING CONVERSION AND REGULATION OF A PRIMARY POWER SOURCE WITHIN A CONVERTING AND REGULATING POWER SUPPLY, AND SYSTEM, and claims any and all benefits and priorities of said earlier filing to which it is entitled therefrom.

FIELD OF THE INVENTION

The present invention relates to DC-DC power converters, and, more specifically, to an active snubber circuit, method of operation thereof and power converter employing the same. The present invention is directed, in general, to pulse width modulated DC-DC power converters which process power from an input DC voltage source and deliver power to a load through an inductive energy storage component being alternatively connected to the input DC power source and to the load via electronic solid state switches.

BACKGROUND OF THE INVENTION

It is known from the art that increasing the operational frequency of DC-DC power converters results in reduction of total weight, size and cost as well as in increase of converted power density, i.e. number of watts per cubic inch.

However, the solid-state switches of the DC-DC power converters are subjected to high power losses as a result of the switch being changed from one state to another (i.e. when the switch turns on or off) while having simultaneously overlapped both a significant current through it and significant (exceeding the primary source level) voltage across it. This results in extensive heat dissipation within the switch during the switching transitions.

For "off-on" transition the switching losses may be defined as:

$$W_{on} = 0.5 V_{sm} I_{sm} t_{on};  \qquad [1]$$

for "on-off" transition the switching losses may be defined as:

$$W_{off} = 0.5 V_{sm} I_{sm} t_{off};  \qquad [2]$$

where: $V_{sm}$ is a voltage-across maximum value during the transition, $I_{sm}$ is a current-through maximum value during the transition, $t_{on}$ is a time-duration of the "off-on" transition, $t_{off}$ is a time-duration of the "on-off" transition.

The switching transition losses evolve substantial constraints upon the potentially available performance rate of existing DC-DC power converters wherein the bipolar junction transistors (BJT), insulated gate bipolar transistors (IGBT) and metal-oxide-semiconductor field-effect transistors (MOSFET) are used as power switches.

Fast switching speeds, low power gate drive and state-on low resistance of MOSFETs have made them a wide practical choice. However, the MOSFETs exhibit large drain-to-source capacitance $C_{oss}$. It reduces the dV/dt factor on turnoff and minimizes the power loss at this transition but increases the power loss at turn-on transition since the power stored in $C_{oss}$ is fully dissipated as heat within the MOSFET, which may be defined as:

$$P_{on} = 0.5 C_{oss} V^2_{sm} f_{op};  \qquad [3]$$

where: $f_{op}$ is an operational frequency value.

To reduce the switching transition power losses within the DC-DC power converters, the prior art brought forward numerous passive, i.e. comprising the inductive and capacitive components only, and active, i.e. comprising solid-state semiconductor devices, snubber circuits optimally shaping the operating points trajectories of the switching devices, i.e. adjusting the shape-of-change of the voltage-across and of the current-through to minimize their simultaneous overlapping during the switching transition.

Passive snubbers are hardly attractive since the power absorbed within their passive components is dissipated as heat. Active snubbers are more efficient since the absorbed power may be re-circulated back to the primary source or forwarded to the load.

Shaping the operating points trajectories of the power switches becomes extremely important function with increasing the operational frequency, operational voltages and overall power conversion output.

As well as the power switches of the DC-DC power converters, the switching devices within prior art active snubbers are also subjected to power losses ascribed with [1] and [2].

Minimizing these "snubber" losses is no less important function both for high and low rates of power conversion since in the latter case the "snubber" losses may be in the row with power conversion output.

Therefore, a better method and apparatus for active shaping the operating points trajectories both of the power switches within the DC-DC power converters and of the switching devices within the apparatus itself is needed to be applicable for use in various DC-DC power converter topologies.

SUMMARY AND ADVANTAGES OF THE INVENTION

The benefits of the proposed invention may be better disclosed through prior appraisal of the state-of-the-art snubber circuits.

Although the present invention may be applicable equally to many existing DC-DC power converter topologies, the boost converter topology is chosen as an example to demonstrate the advantages of the present invention.

The output voltage of the boost converter is always higher than the peak value of the mains voltage, and would be typically between 300 and 400 volts. At these high voltage levels the switching transition losses are unavoidably great, and transient voltage and current spikes may well damage the solid-state semiconductor devices. For this reason a fast-recovery blocking rectifier is required. At a high operational frequency, a fast-recovery rectifier is subjected to substantial reverse-recovery current and, therefore, produces significant reverse-recovery loss when operated under a "hard switching" condition, i.e. when simultaneous overlapping of non-zero-voltage-across with nonzero-current-through during the switching transition.

Besides, as being galvanically non-isolated of the primary power source, the boost converters are quite sensitive to reverse-recovery sufficiency to prevent the internal components of electric shoot-through destruction. As a result, the "hard-switched" DC-DC power converters are operated at relatively low switching frequencies.

To reduce the switching transition losses while increasing the switching frequency and, therefore, to improve the efficiency of DC-DC power conversion, a number of "soft-switching" techniques have been proposed within the prior art.

"Soft-switching" condition occurs when no voltage appears across the switch and/or no current flows through the switch during the switching transition.

Turning the power switch into conducting state at zero voltage across it (ZVS=Zero Voltage Switching) results in elimination of two kinds of switching transition losses: the first, caused by blocking rectifier reverse-recovery loss as defined in [2] and, the second, caused by the power switch stray capacitance recharge as defined in [3].

Turning the power switch into nonconducting state at zero current through it (ZCS=Zero Current Switching) results in elimination of inductively stored power loss which may be defined as:

$$P_{off}=0,5LI_{sm}f_{op},\qquad [4]$$

where: L is an inductance value of the power storage inductor.

FIG. 1 illustrates the circuit diagrams of DC-DC power converters comprising some of the prior art snubber circuitry for soft-switching conditions provision and for switching transition loss reduction, and indexed structures are as follows:

200: prior art snubber;

209: controllable commutator;

210: controllable commutating switch within the controllable commutator 209;

211: rectifier within the first commutator 209;

213: commutating rectifier;

215: damp rectifier;

216: resonant inductor;

$L_H$: auxiliary saturable inductor;

217: first slope-shaping capacitor;

218: second slope-shaping capacitor;

304: main power switch;

305: power storage inductor;

306: blocking rectifier;

307: output smoothing filter;

308: primary power source;

309: load.

These prior art techniques utilize an auxiliary active commutator 209 together with a few passive components like resonant inductor 216 and voltage slope-shaping capacitors 217, 218 thus forming an active snubber to limit the rate-of-change of blocking rectifier 306 current ($di_{306}/dt$) and to create the soft-switching conditions for the main power switch 304. As a result the main power switch 304 is tuned-on into conducting state under zero-voltage across it. However, the auxiliary active commutator 209 shown in FIG. 1(a) operates under hard-switching condition since it is turned-off into non-conducting state while carrying a current greater than the input current, and subsequently turned-on into conducting state while the voltage across it is equal to the output voltage. Since the peak resonant current within the resonant inductor 216 may be twice greater as within the power storage 305 to satisfy the zero-voltage soft-switching condition for the main power switch 304, then turning-off the auxiliary active commutator 209 into non-conducting state is accomplished with considerable power loss.

To reduce the switching loss within the auxiliary active commutator 209 the snubber circuits shown in FIGS. 1(b, c, d, e) have been proposed in the prior art.

However, the next drawback of the prior art techniques is undesirable resonance between the output capacitance $C_{oss}$ of the auxiliary active commutator 209 and the resonant inductor 216. Attempting to eliminate this resonance by including an auxiliary saturable inductor $L_H$, as shown in FIG. 1(a) increases the number of coil components and the overall cost. Besides, due to undesirable circulation of magnetically stored energy within the resonant inductor 216, it is a source of transient EMI noise, and also produces additional power loss. To eliminate undesirable power circulation the snubber circuits shown in FIGS. 1(b, c) include auxiliary components increasing the overall complexity and associated power loss.

The common drawback of the described above prior art circuitry is evolved by undesirable resonant circulation of energy between the resonant inductor 216 and multiple parasitic capacitance within the snubber circuit 200, which also produces power loss accomplished with voltage spikes and EMI radiation affecting the electronic equipment. The finite time of resonant circulation results in limiting the power conversion operational duty factor and in limiting the opportunity to increase the power conversion operational frequency.

Besides, the prior art circuitry shown in FIG. 1 cannot be incorporated into the isolated DC-DC power converter topologies.

Other prior art techniques require too complex control circuitry which are sensitive to transient noise.

Therefore, what is needed in the art is a circuit that eliminates the above described drawbacks.

The purpose of this invention is to reduce the switching transition losses of power within switching devices of the switching type pulse-width-modulated DC-DC power converters of various topologies, therefore to create a family of modified converters of a higher efficiency than the prior art by including the active soft-switching conditioner into conventional converter structures.

The advantages of the proposed invention are that through active shaping the operating points trajectories of the switching devices both within the DC-DC power converter structure and within the active soft-switching conditioner the following benefits are achieved:

providing soft-switching zero-voltage-across/zero-current-through conditions within the time intervals of alternative changing between conducting and non-conducting states both for power switching devices of the converter and for networks commutating devices of the active soft-switching conditioner;

eliminating the switching transition power losses resulted from simultaneous overlapping non-zero-voltage-across/non-zero-current-through conditions during switching transitions within the power switching devices and within the networks commutating devices;

reducing the conduction power losses within the power switching devices;

increasing the power conversion operational frequency increase and hence the power storing components decrease in weight and volume;

improving the dynamic controllability of the converter and the power conversion process regulation quality;

reducing the radiated EMI;

re-circulating the energy absorbed by the active soft-switching conditioner back to the primary power source or forwarding it to the load of the converter.

According to the invention, the modified converters comprise at least; an input means to be connected to the primary power source; an output means to be connected to the load;

- a common return bus to be connected between the primary power source and the load;
- a power storage inductor to accumulate the power absorbed from the primary power source and to deliver the power to the load;
- a controllable power switch operated in a pulse-width-modulated fashion and alternatively turned into conducting state to provide the power absorption from the primary power source into the power storage inductor and turned into nonconducting state to provide the power release from the power storage inductor into the load;
- a power rectifier to disconnect the load from the power storage inductor and from the primary power source while the controllable power switch is conducting and to provide the power release path from the power storage inductor and from the primary power source to the load while the controllable power switch is non-conducting;
- an output smoothing filter to store the power delivered to the load and to absorb the ripple component of delivered power;
- a active soft-switching conditioner connected through its nodes across the controllable power switch to provide active shaping the operating points trajectories of the switching devices through active developing soft-switching zero-voltage-across/zero-current-through conditions within the time intervals of alternative changing between conducting and nonconducting states.

The active soft-switching conditioner comprises at least:
an input node, an output node, a common node;
- a separator comprising at least a rectifier to separate the networks within the active soft-switching conditioner;
- first commutator comprising a controllable switch connected in parallel with a rectifier to provide first controllable path for currents within the network of the active soft-switching conditioner;
- second commutator comprising at least a rectifier to provide second controllable path for currents within the network of the active soft-switching conditioner;
- third commutator to provide third controllable path for currents within the network of the active soft-switching conditioner;
- fourth commutator comprising a rectifier or, according to the embodiment of active soft-switching conditioner, a controllable switch connected in parallel with a rectifier to provide fourth controllable path for currents within the network of the active soft-switching conditioner;
- first slope-shaper comprising at least a capacitor to provide shaping the voltage wave form developed across the controllable power switch during its transition into non-conducting state, therefore creating soft-switching zero-voltage-across condition for the controllable power switch during its transition into non-conducting state such that the controllable power switch transition into non-conducting state does not produce power loss;
- second slope-shaper comprising at least one capacitor to provide shaping the voltage wave form developed across the first commutator, therefore creating soft-switching zero-voltage-across/zero-current-through conditions during the first commutator transition into non-conducting state such that the first commutator transition into nonconducting state does not produce power loss;
- damp/resonant choke to provide the prescribed rate-of-change for the current through the power rectifier during its transition into non-conducting state, therefore creating soft-switching close to zero-current-through condition for the power rectifier during its transition into nonconducting state such that the power rectifier transition into non-conducting state does not produce power loss, and to provide the resonant discharge path for the capacitor within the first slope-shaper for shaping the voltage wave form developed across the controllable power switch during its transition into conducting state, therefore creating soft-switching zero-voltage-across/zero-current-through condition for the controllable power switch during its transition into conducting state such that the controllable power switch transition into conducting state does not produce power loss;
- damp switch comprising at least a rectifier or a controllable switch connected in parallel with a rectifier to provide a current path to release the energy magnetically stored within the damp/resonant choke, and to damp the parasitic circulation of energy magnetically stored within the damp/resonant choke;
- the first slope-shaper is connected between the input node and the common node to shunt the controllable power switch;

A controllable switch within the first commutator is turned into conducting state prior to the controllable power switch transition into conducting state to provide the prescribed rate-of-change for the current through the power rectifier during its transition into non-conducting state, therefore creating soft-switching close to zero-current-through condition for the power rectifier during its transition into non-conducting state such that the power rectifier transition into non-conducting state does not produce power loss, and to provide the resonant discharge path for the capacitor within the first slope-shaper, therefore creating soft-switching zero-voltage-across/zero-current-through condition for the controllable power switch during its transition into conducting state such that the controllable power switch transition into conducting state does not produce power loss;

Past the controllable switch within the first commutator is turned into non-conducting state the second slope-shaper is connected across the damp/resonant choke to shunt it and to absorb its released energy, therefore to provide the prescribed shape-of-change for the voltage across the first commutator during its transition into non-conducting state, therefore creating soft-switching zero-voltage-across/zero-current-through condition for the first commutator such that the first commutator transition into non-conducting state does not produce power loss;

- the third commutator connected with the second slope-shaper is adapted to limit the voltage level across the second slope-shaper during resonant release of energy magnetically stored within the damp/resonant choke, and to provide a discharge path for the capacitor(s) within the second slope-shaper past the controllable power switch transition into non-conducting state, and to provide a prescribed rate-of-change for the voltage across the controllable power switch during its transition into non-conducting state, therefore creating soft-switching zero-voltage-across condition for the controllable power switch such that its transition into non-conducting state does not produce power loss.

The separator in conjunction with third commutator and fourth commutator provides an opportunity to re-circulate the energy magnetically absorbed into the damp/resonant choke both to the primary power source or to the load by cutting the absorbed energy release path off the controllable power switch and off the power storage inductor by turning the fourth commutator into non-conducting state, therefore enhancing the functional applicability of the active soft-switching conditioner towards greater number of different converter topologies.

Past the controllable power switch transition into non-conducting state, first slope-shaper by charging its internal capacitor, and second slope-shaper by discharging its internal capacitor(s) to the primary power source or to the load, both shunt the controllable power switch therefore diverting its current and providing the soft-switching zero-voltage-across conditions to eliminate the switching transition power loss within the controllable power switch. When the controllable power switch is performed as a solid-state semiconductor device then its stray capacitor may be used for the first slope-shaper.

The damp switch commutates the damp/resonant choke with magnetically stored energy release circuit such that the damp/resonant choke is disconnected from the magnetically stored energy release circuit as soon as the current through the damp/resonant choke reaches close to zero, therefore eliminating the parasitic circulation of energy magnetically stored within the damp/resonant choke, hence improving the dynamic controllability of the converter and the power conversion process regulation quality, and reducing the radiated EMI.

The controllable power switch and all controllable switches within the damp switch, within the first commutator and within the fourth commutator may be performed as solid-state semiconductor switches.

The body diodes of the solid-state semiconductor switches may be used as the rectifiers connected across the controllable switch within the damp switch, across the controllable switch within the first commutator and across the controllable switch within the fourth commutator.

The high-power pulse diodes may be used as the power rectifier, the separator and the third commutator.

The further purpose of the proposed invention is the method to reduce the power losses within the switching devices of the power converters comprising the discussed active soft-switching conditioner, including the following steps:

turning simultaneously into conducting state both the controllable switch within the first commutator and the controllable switch within the fourth commutator prior to the controllable power switch transition into conducting state to provide the prescribed rate-of-change for the current through the power rectifier during its transition into non-conducting state, therefore creating soft-switching close to zero-current-through condition for the power rectifier such that its transition into non-conducting state does not produce power loss, and to provide the resonant discharge path for the capacitor within the first slope-shaper, therefore creating soft-switching zero-voltage-across/zero-current-through condition for the controllable power switch such that its turning the power rectifier into non-conducting state with soft recovery of its reverse resistance under soft-switching close to zero-current-through condition hence losslessly disconnecting the load from the power storage inductor and from the primary power source;

connecting the power storage inductor to the primary power source for power absorption and accumulation through the networks within the active soft-switching conditioner;

turning the controllable power switch into conducting state under soft-switching zero-voltage-across/zero-current-through conditions hence connecting the power storage inductor to the primary power source for power absorption and accumulation;

shunting the damp/resonant choke with a series-connection network comprising the second slope-shaper connected with the damp switch to provide the prescribed shape-of-change for the voltage across the first commutator as soon as its transition into non-conducting state starts and for the voltage across the fourth commutator as soon as its transition into non-conducting state starts, therefore creating soft-switching zero-voltage-across/zero-current-through conditions for the first commutator transition into non-conducting state and for the fourth commutator transition into non-conducting state such that the first commutator transition into non-conducting state and the fourth commutator transition into nonconducting state do not produce power losses;

releasing the energy magnetically stored within the damp/resonant choke through the forward-biased second commutator, through the forward-biased separator and through the forward-biased damp switch into the capacitors within the second slope-shaper and further into the output node as soon as past a prescribed time the third commutator becomes forward-biased/conducting;

turning the damp switch into non-conducting state as soon as its carried current decreases close to zero and soft-switching zero-current-through condition occurs, therefore eliminating the parasitic circulation of energy magnetically stored within the damp/resonant choke;

recovering the second commutator reverse resistance under soft-switching close to zero-current-through condition;

absorbing the power from the primary power source into the power storage inductor through the controllable power switch;

turning the controllable power switch into non-conducting state under soft-switching zero-voltage-across condition;

absorbing the power from the primary power source into the power storage inductor through linear charging the first slope-shaper and through linear discharging the second slope-shaper;

connecting the primary power source and the power storage inductor to the load as a result of the power rectifier transition into conducting state and forwarding the absorbed and accumulated power from the power storage inductor to the load and to the output smoothing filter.

According to the method and apparatus disclosed, the further advantages may therefore outflow evolving the following opportunities:

provision of soft-switching zero-voltage-across/zero-current-through conditions within the time intervals of alternative changing between conducting and non-conducting states both for power switching devices of the DC-DC power converter and for networks commutating devices of the active soft-switching conditioner;

elimination of the switching transition power losses resulted from simultaneous overlapping of non-zero-voltage-across/non-zero-current-through conditions during switching transitions within the power switching devices and within the networks commutating devices;

reduction of the conduction power losses within the power switching devices;

increase of the power conversion operational frequency and hence decrease in weight and size of the power storing components;

improvement of the dynamic controllability of the DC-DC power converter and of the power conversion process regulation quality;

reduction of the radiated EMI;

re-circulation of the energy absorbed by the active soft-switching conditioner back to the primary power source or forward to the load of the converter;

applicability for use in various DC-DC power converter topologies;

applicability for use in isolated DC-DC power converter topologies.

Numerous other advantages and features of the present invention will become readily apparent from the following detailed description of the invention and the embodiments thereof, from the claims and from the accompanying drawings.

BRIEF DESCRIPTION OF DRAWINGS

FIG. 1 illustrates the circuit diagrams of power converters comprising the prior art circuitry for switching transition loss reduction.

FIGS. 4, 5(a)–(p) illustrate the timely-scaled wave forms of currents and voltages attributed to the switching devices within the power converters comprising the discussed embodiments of active soft-switching conditioner according to the invention.

DETAILED DESCRIPTION OF THE PREFERRED EMBODIMENTS

Figure 2:
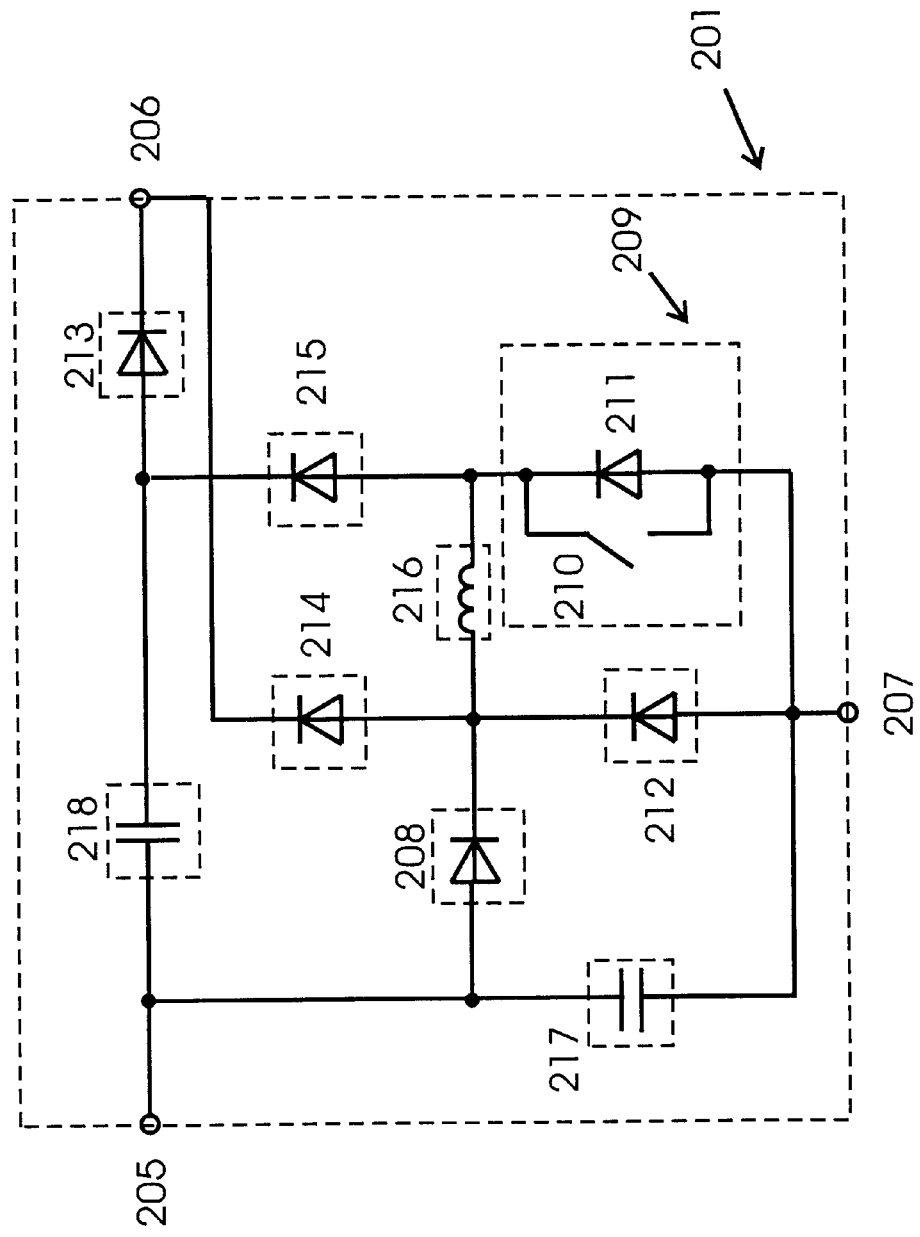
FIGS. 2(a)–(h) illustrates the circuit diagrams of various embodiments of active soft-switching conditioner according to the invention.
Figure 2:
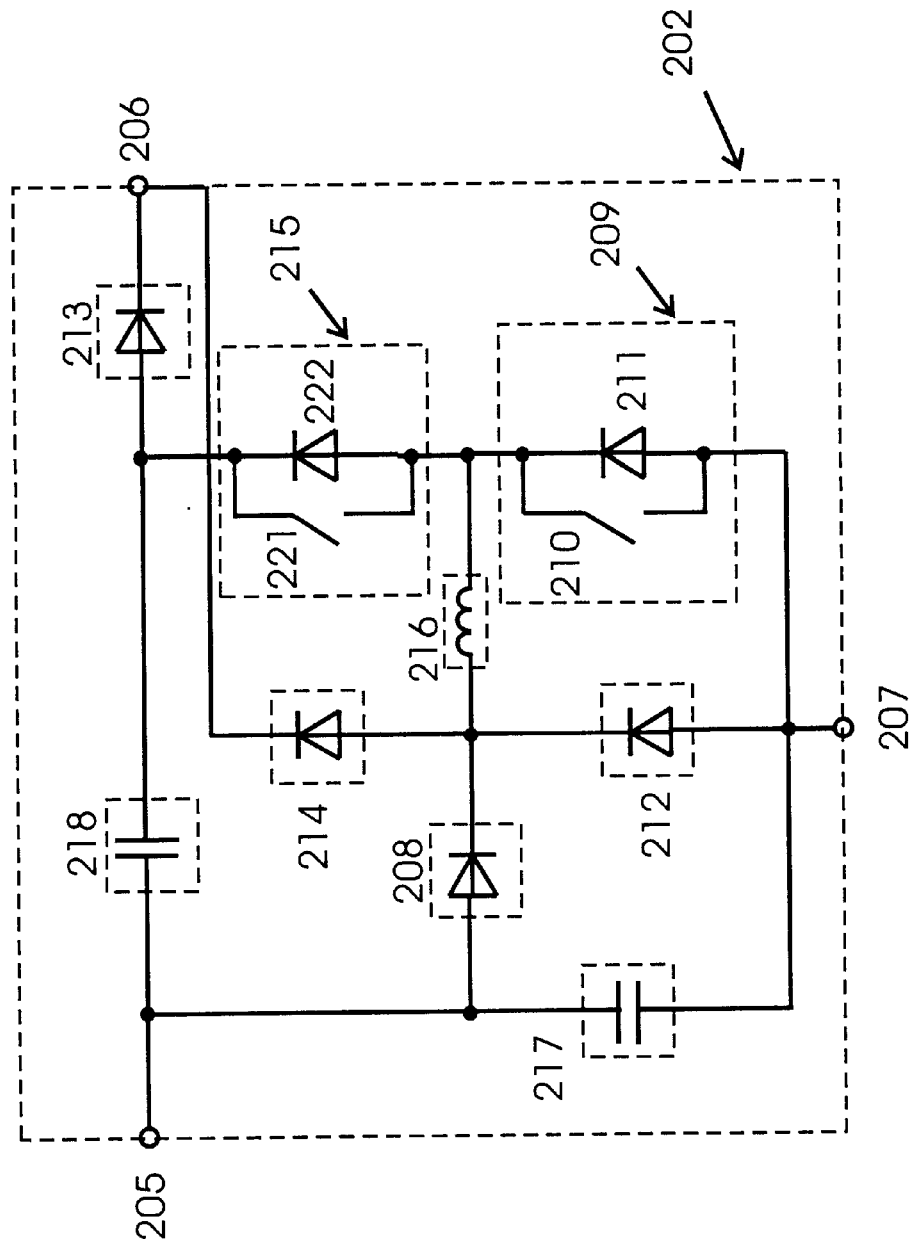
Figure 2:
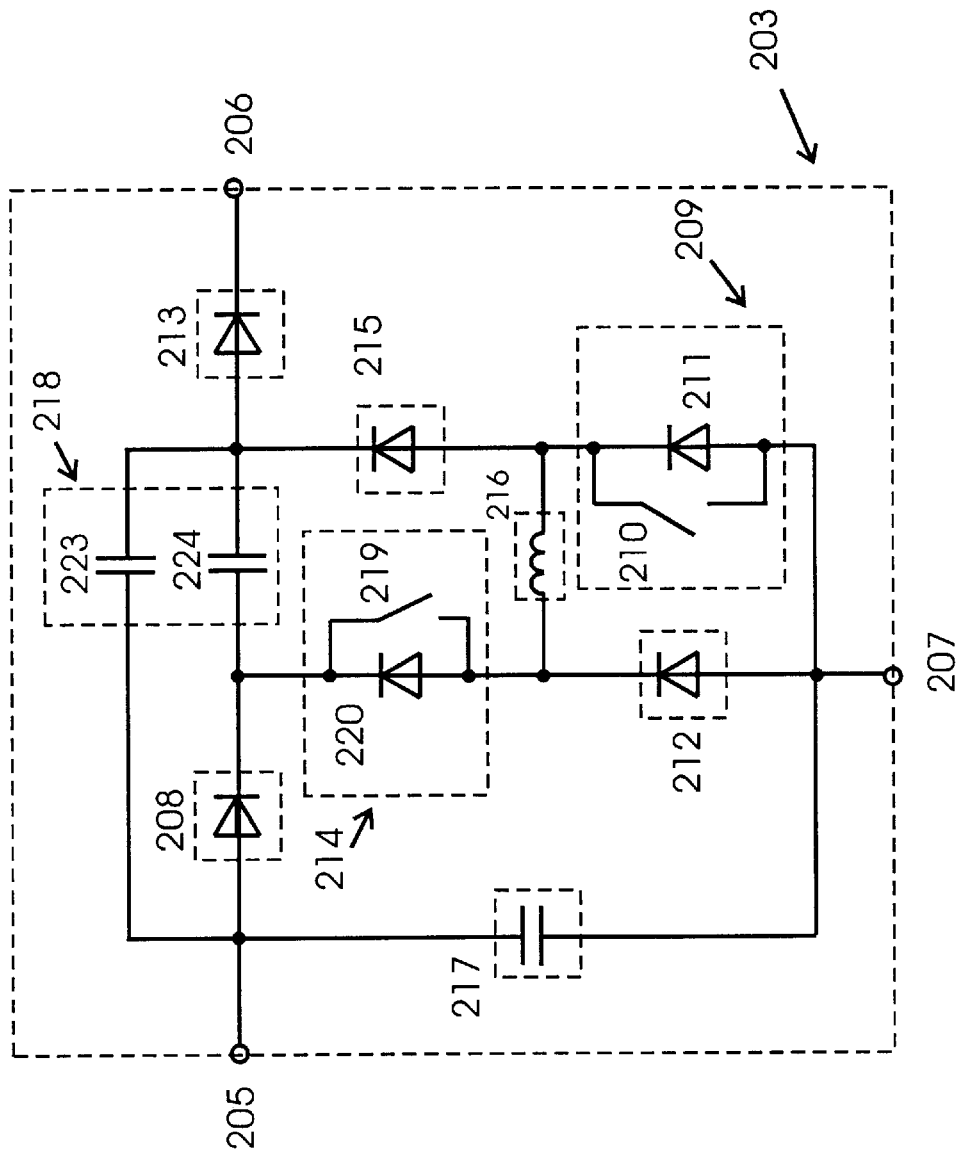
Figure 2:
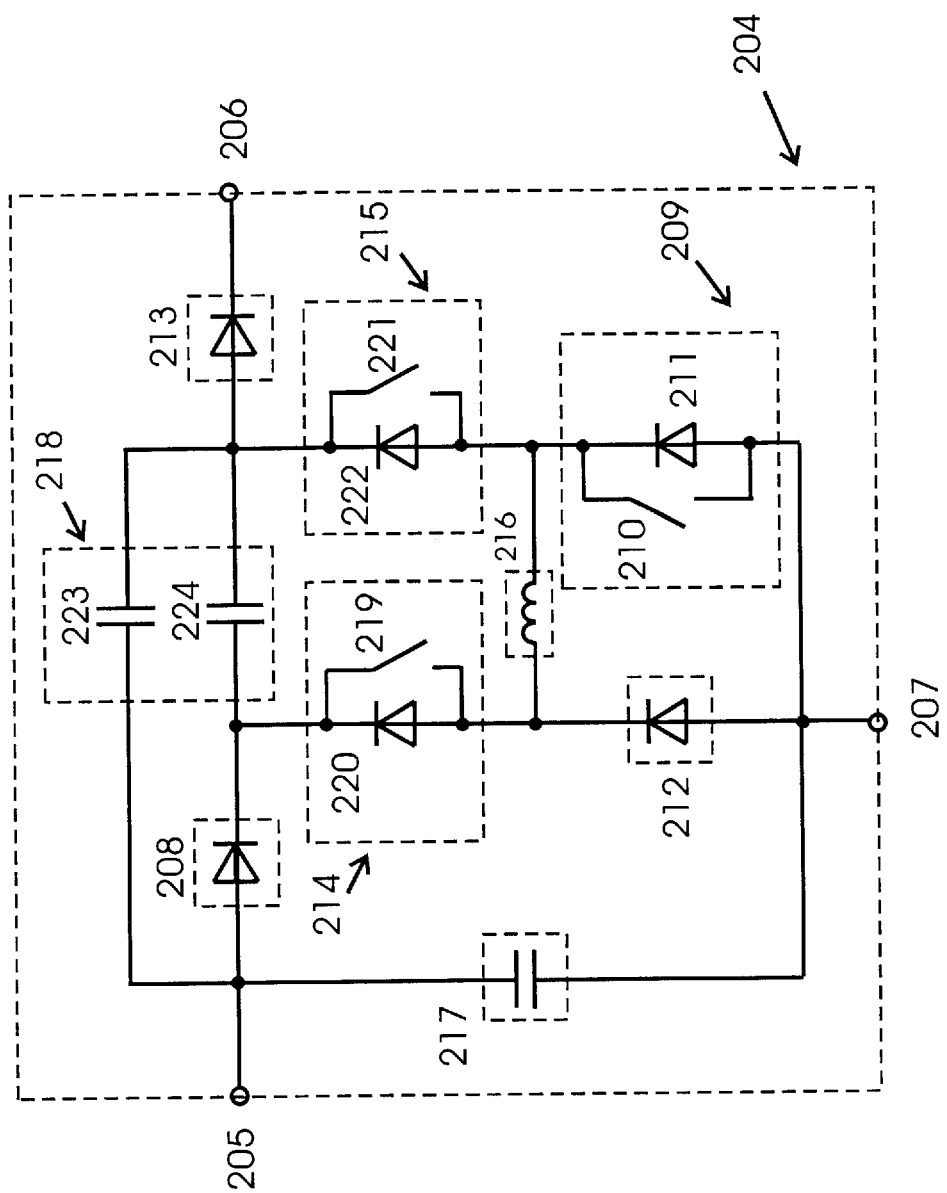
Figure 2:
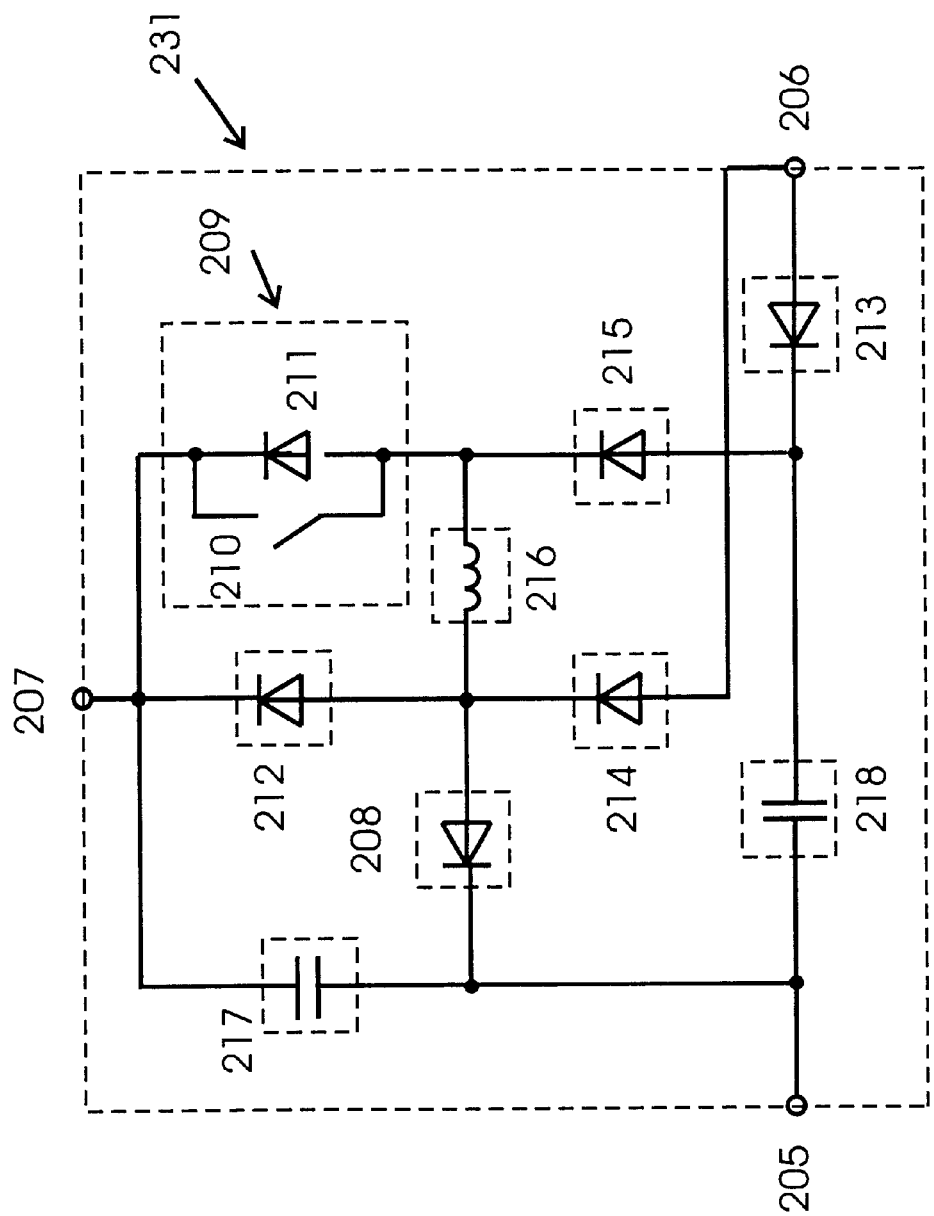
Figure 2:
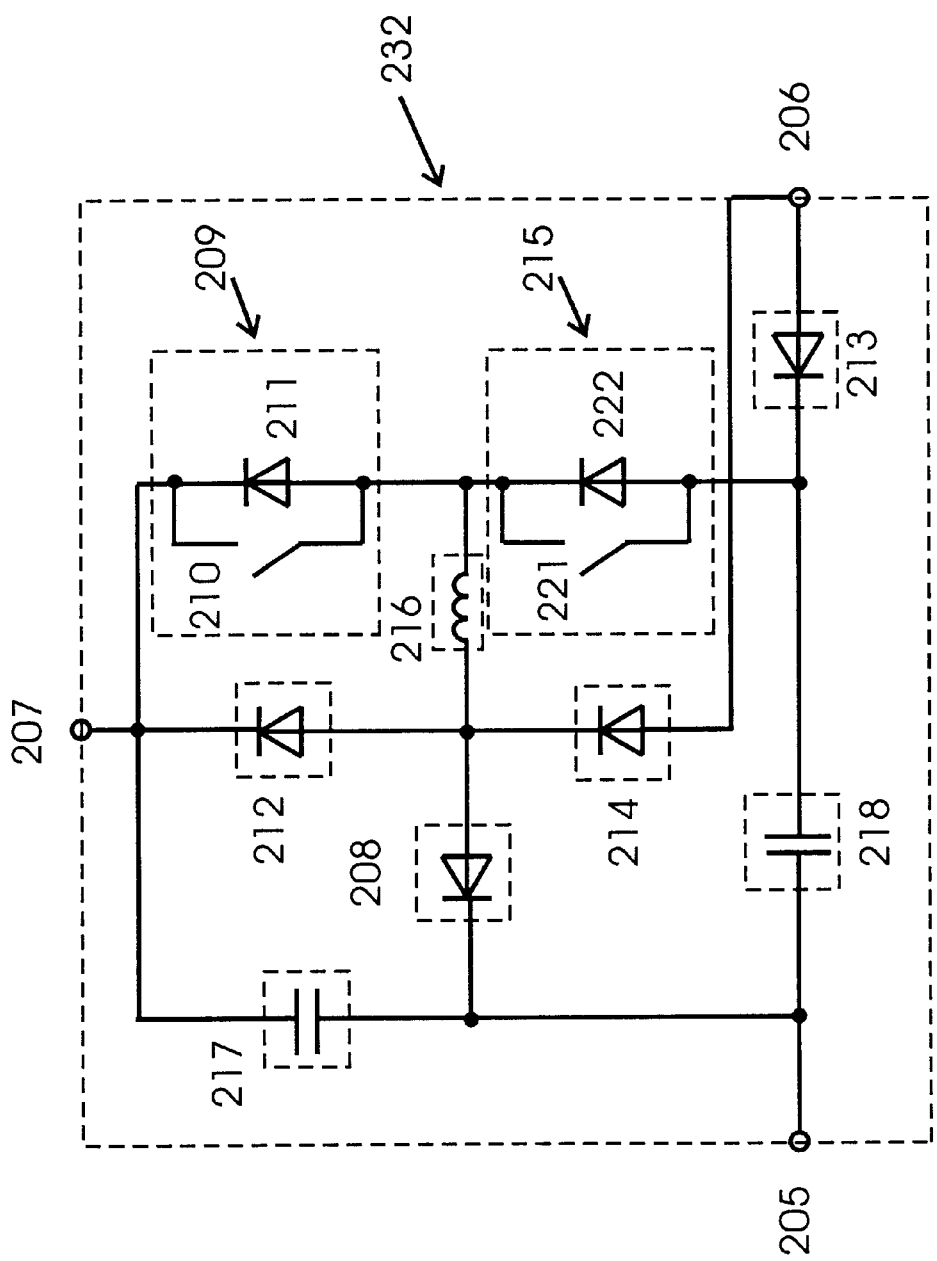
Figure 2:
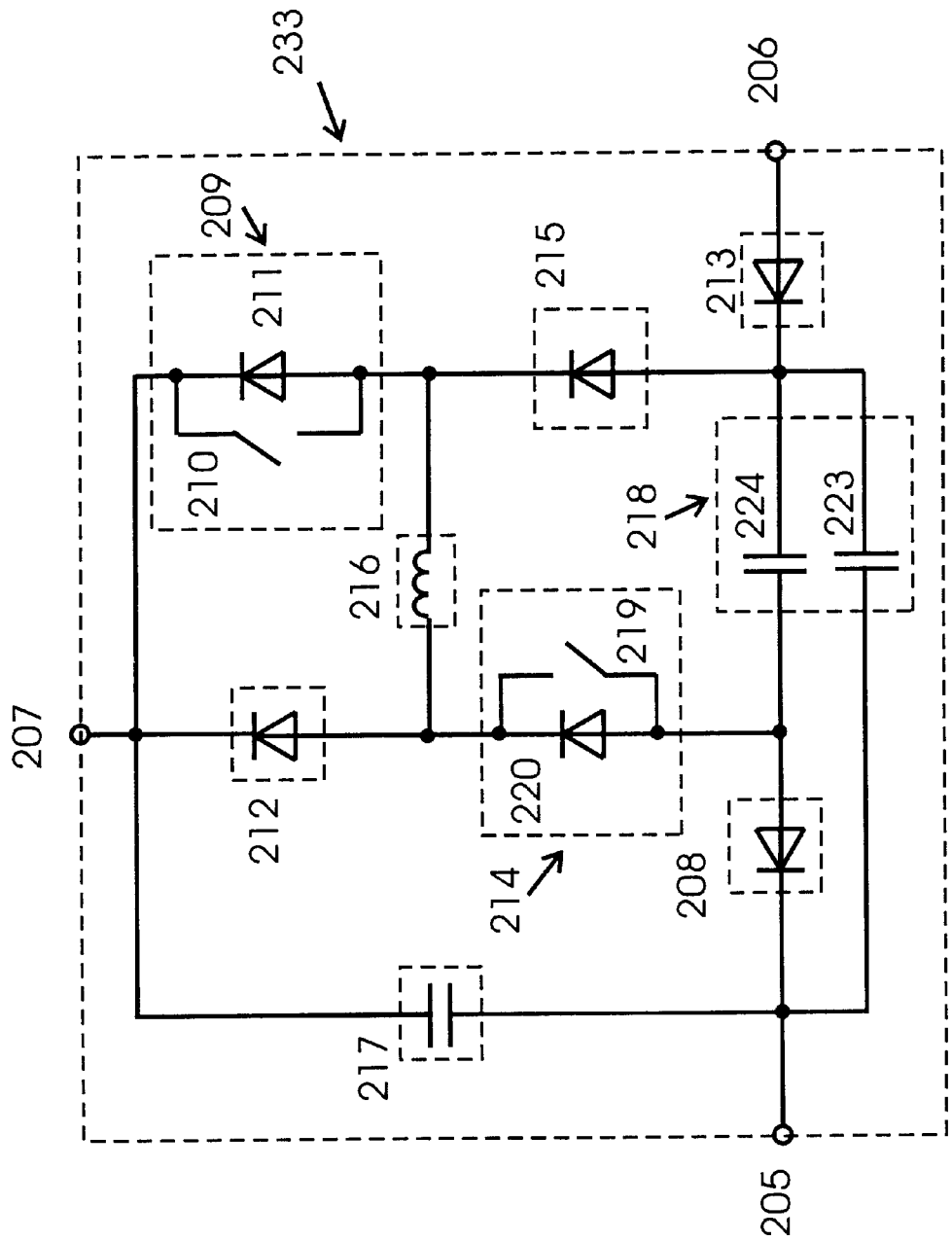
Figure 2:
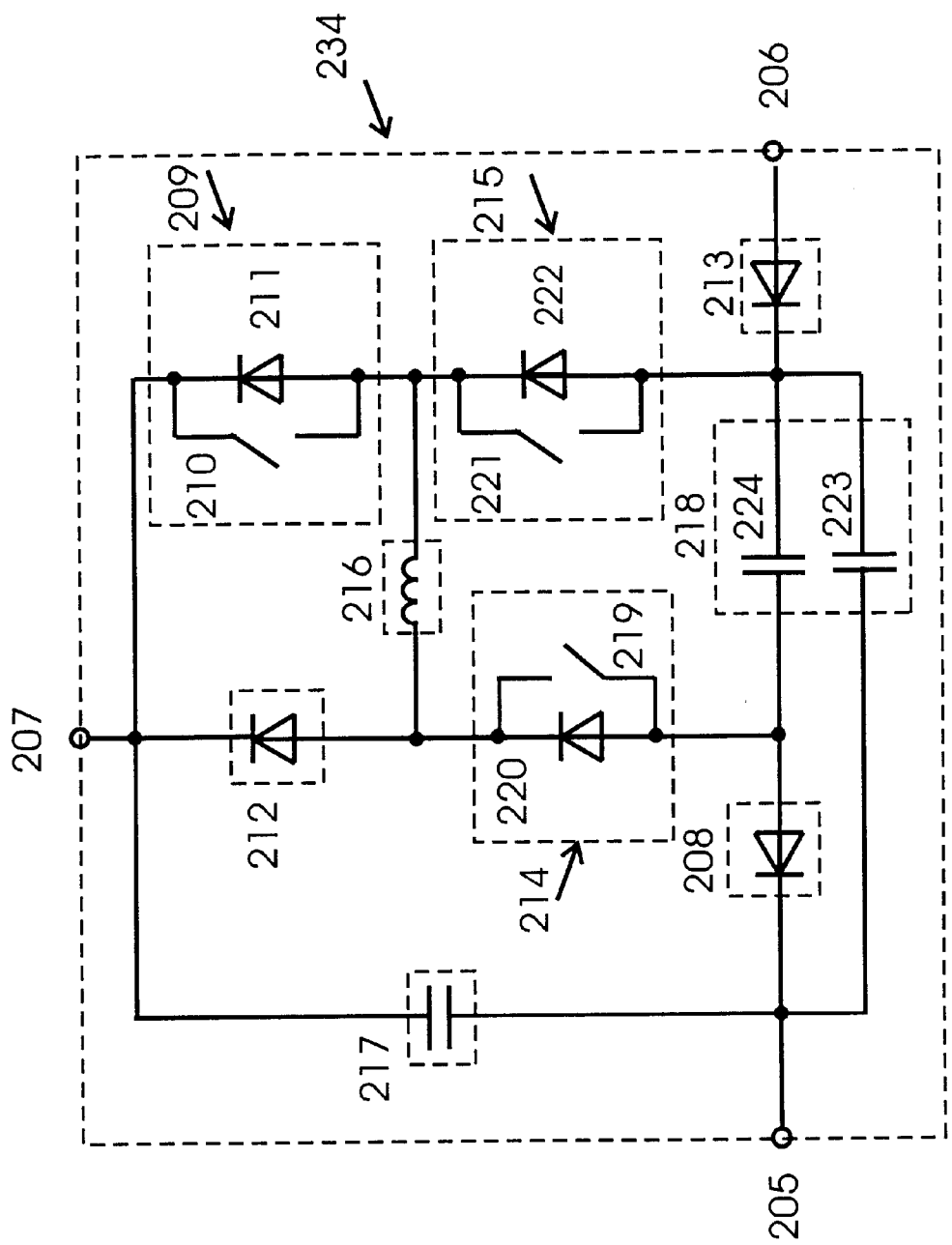

The description that follows is presented to enable one skilled in the art to make and use the present invention, and is provided in the context of a particular application and its requirements. Various modifications to the disclosed embodiments will be apparent to those skilled in the art, and the general principals discussed below may be applied to other embodiments and applications without departing from the scope and spirit of the invention. Therefore, the invention is not intended to be limited to the embodiments disclosed, but the invention is to be given the largest possible scope which is consistent with the principals and features described herein.

In the embodiments of the proposed invention shown in FIG. 2 and in FIG. 3 the indexed structures are as follows:

201: first embodiment of the active soft-switching conditioner;

202: second embodiment of the active soft-switching conditioner;

203: third embodiment of the active soft-switching conditioner;

204: fourth embodiment of the active soft-switching conditioner;

205: input node of the active soft-switching conditioner;

206: output node of the active soft-switching conditioner;

207: common node of the active soft-switching conditioner;

208: separator;

209: first commutator;

210: controllable commutating switch within the first commutator 209;

211: rectifier within the first commutator 209;

212: second commutator;

213: third commutator;

214: fourth commutator;

215: damp switch;

216: damp/resonant choke;

217: first slope-shaper;

218: second slope-shaper;

219: controllable commutating switch within the fourth commutator 214;

220: rectifier within the fourth commutator 214;

221: controllable commutating switch within the damp switch 215;

222: rectifier within the damp switch 215;

223: first slope-shaping capacitor;

224: second slope-shaping capacitor;

231: fifth embodiment of the active soft-switching conditioner;

232: sixth embodiment of the active soft-switching conditioner;

233: seventh embodiment of the active soft-switching conditioner;

234: eighth embodiment of the active soft-switching conditioner;

301: DC-DC converter incorporating second embodiment 202 of the active soft-switching conditioner;

302: DC-DC converter incorporating fourth embodiment 204 of the active soft-switching conditioner;

303: DC-DC converter incorporating fourth embodiment 204 of the active soft-switching conditioner;

304: controllable power switch.

305: power storage inductor.

306: power rectifier.

307: output smoothing filter.

308: primary power source.

309: load.

Figure 3:
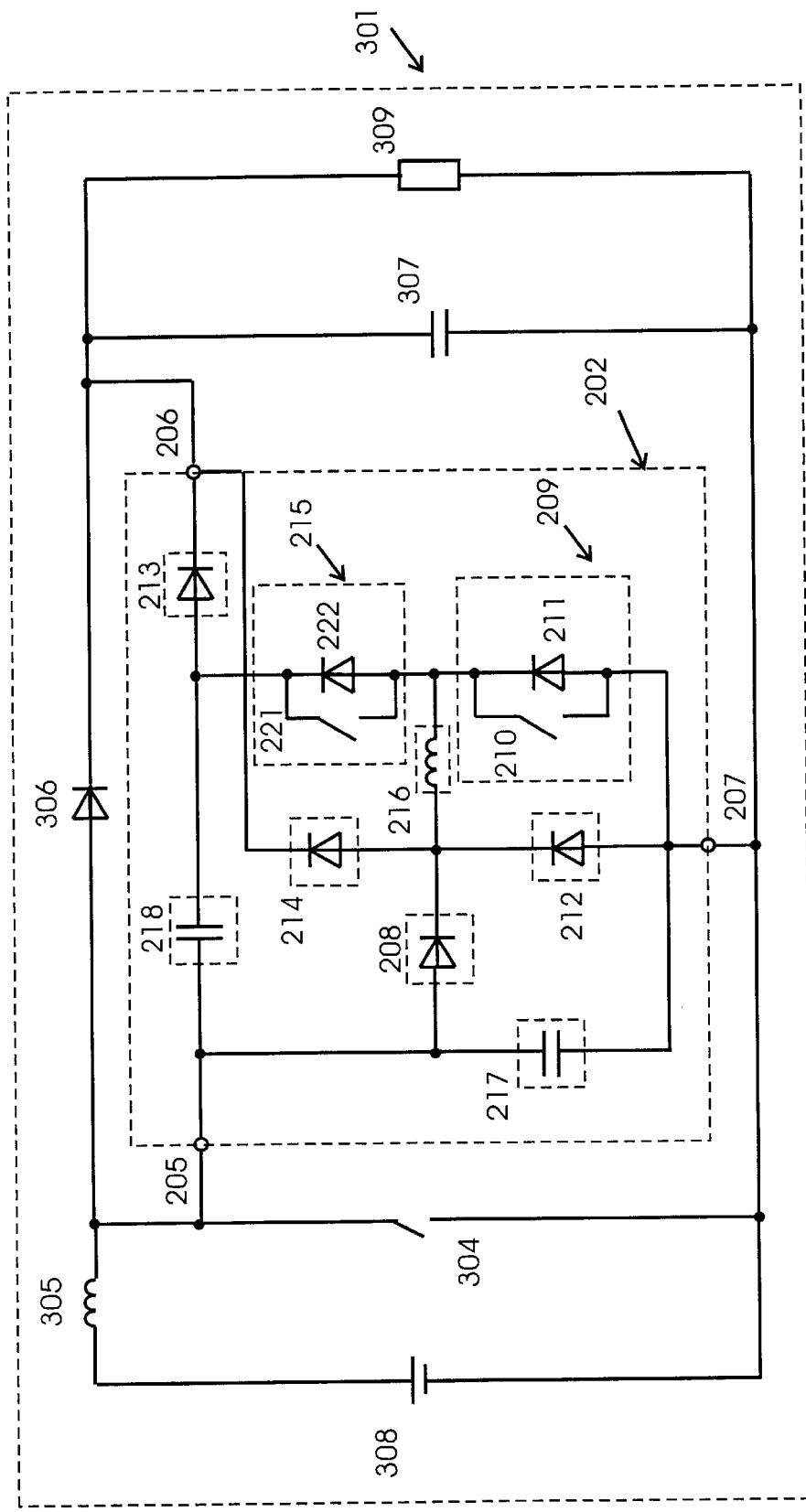
FIGS. 3(a)–(c) illustrates the circuit diagrams of power converters comprising the discussed embodiments of active soft-switching conditioner according to the invention.
Figure 3:
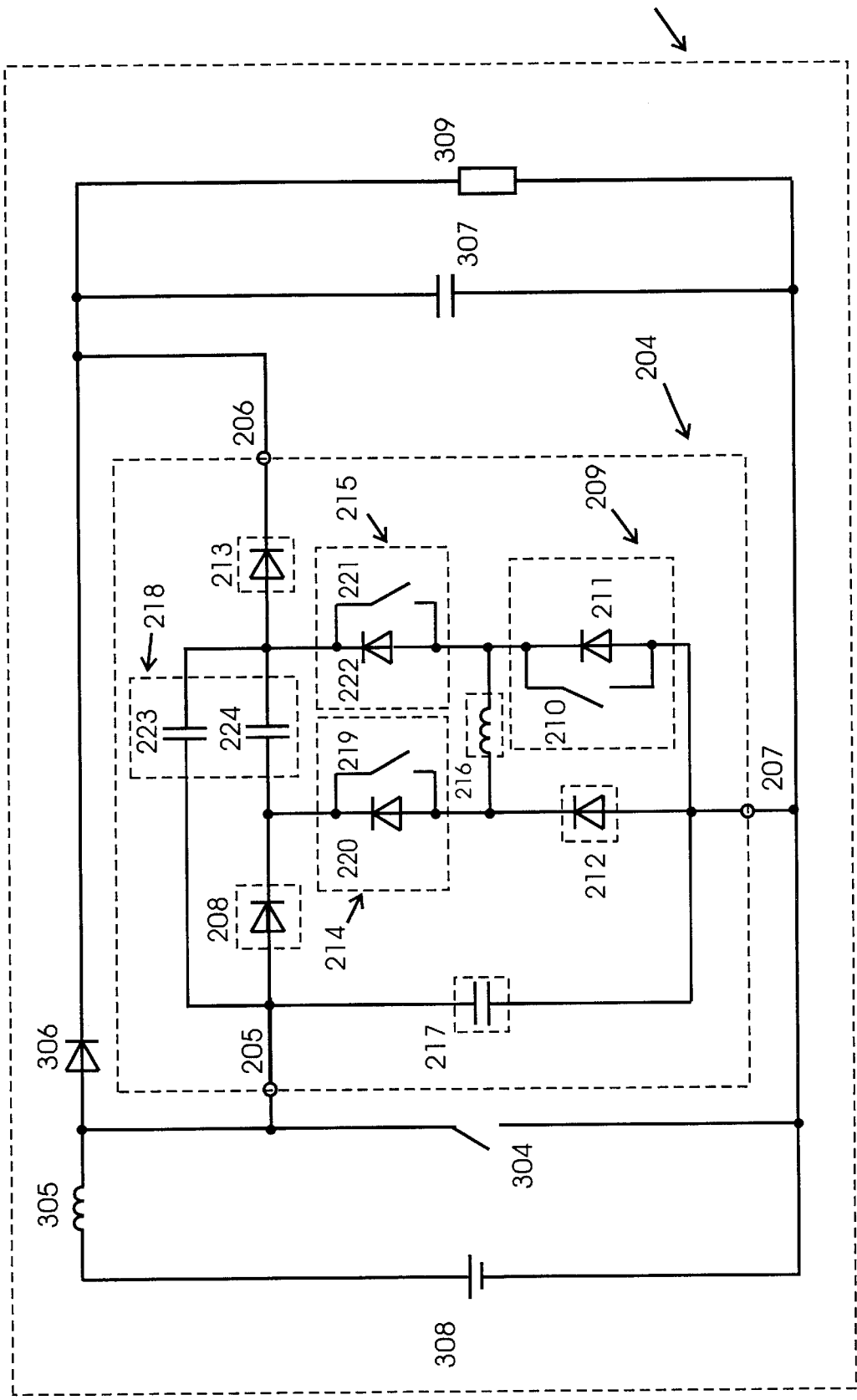

Each of DC-DC converters 301, 302, 303 includes a controllable power switch 304, a power storage inductor 305, a power rectifier 306, an output smoothing filter 307, a primary power source 308 and a load 309 configured in a conventional boost converter configuration, as shown in FIGS. 3(a, b, c).

Without any active soft-switching conditioner being incorporated into conventional boost converter its operation is as follows.

In the quasi-steady state prior to some reference time like chosen for example $t_{10}$ shown in FIGS. 4(b, d, e) the controllable power switch 304 is closed/conducting, the power storage inductor 305 is connected across the primary power source 308, the power rectifier 306 is non-conducting while being reverse-biased by the voltage stored across the output smoothing filter 307, therefore the load 309 is disabled off the primary power source 308.

While input voltage $V_{in}$ of the primary power source 308 is applied across the power storage inductor 305 the current through it increases in a linear fashion and, thus accumulating power within the power storage inductor 305, reaches its maximum value at time $t_{10}$.

Now the controllable power switch 304 is turned into open/non-conducting state, the power rectifier 306 turns into forward-biased/conducting state, and the power stored within the power storage inductor 305 is transferred through the power rectifier 306 to the output smoothing filter 307 and to the load 309. The current through the power storage inductor 305 starts decreasing in a linear fashion and reaches its minimum value by the end of operational duty cycle.

To start the next operational cycle the controllable power switch 304 is turned into closed/conducting state again thus reverse-biasing the power rectifier 306.

The above described may be true for ideal case only when on/off-turn transition time of the controllable power switch 304 and of the power rectifier 306 may be respected as negligibly short in comparison with operational duty cycle duration.

Under real circumstances the semiconductor devices exhibit inertia properties as a result of residual stored charge, parasitic capacitance's, etc.

Due to them, as example, the excessive carriers within the base of the power rectifier 306 cannot dissipate immediately after the power rectifier 306 having been reverse-biased thus resulting in a short-time loss of its rectifying properties which leads to an excessive reverse current, to an excessive heat dissipation within the power rectifier 306 due to reverse voltage drop across it and to an excessive current stress through the controllable power switch 304 during its turn-on/conducting since discharging the output smoothing filter 307 in a short-circuit mode.

Only after excessive carriers dissipation within the base of the power rectifier 306 is over its reverse resistance recovery starts. Therefore the amount of switching losses within the power rectifier 306 and within the controllable power switch 304 substantially depends on excessive carriers dissipation time.

Switching the controllable power switch 304 into open/non-conducting state is also accompanied with substantial power losses and internal heat dissipation since due to residual capacitance of the switch the current through it cannot decrease immediately from maximal value to zero under high voltage across the switch.

Incorporating the active soft-switching conditioner into conventional boost converter substantially improves its efficiency.

For each of the DC-DC converters 301, 302, 303 the input node 205 and common node 207 of the active soft-switching conditioner 202, as shown in FIG. 3(a), and of the active soft-switching conditioner 204, as shown in FIGS. 3(b, c), are connected across the controllable power switch 304. The output node 206 of the active soft-switching conditioners may be connected to the load 309, as shown in FIGS. 3(a, c), or to the primary power source 308, as shown in FIG. 3(b).

With a active soft-switching conditioner 202 shown in FIG. 2(b) being incorporated into conventional boost converter, as shown in FIG. 3(a), its operation is as follows.

In the quasi-steady state prior to time $t_0$ the controllable power switch 304 ascribed with current $i_{304}(t)$ and with voltage $u_{304}(t)$ in FIG. 4(e) is open/non-conducting, the power rectifier 306 ascribed with current $i_{306}(t)$ in FIG. 4(d) as well as the rectifier within the separator 208 ascribed with current $i_{208}(t)$ and with voltage $u_{208}(t)$ in FIG. 4(i), and the rectifier within the fourth commutator 214 ascribed with current $i_{214}(t)$ and with voltage $u_{214}(t)$ in FIG. 4(g) all are forward-biased/conducting thus providing the power path from the primary power source 308 and from the power storage inductor 305 ascribed as current $i_{305}(t)$ in FIG. 4(d) to the output smoothing filter 307 and to the load 309.

Except above mentioned structures 208 and 214, the remaining components of the active soft-switching conditioner 202 are current-free: the controllable commutating switch 210 within the first commutator 209 ascribed with current $i_{209}(t)$ and with voltage $u_{209}(t)$ in FIG. 4(f) and the damp switch 215 ascribed with voltage $u_{215}(t)$ in FIG. 4(h) are open/non-conducting, the capacitor within the first slope-shaper 217 ascribed with current $i_{217}(t)$ and with voltage $u_{217}(t)$ in FIG. 4(l) is charged to output voltage level $V_{out}$, the capacitor within the second slope-shaper 218 ascribed with current $i_{218}(t)$ and with voltage $u_{218}(t)$ in FIG. 4(m) is discharged to zero.

At time $t_0$ the control pulse ascribed as $u_{G209}(t)$ in FIG. 4(a) triggers the controllable commutating switch 210 within the first commutator 209 into closed/conducting state, and now the output voltage $V_{out}$ is applied to the network of series-connected power rectifier 306, separator 208, damp/resonant choke 216 and controllable commutating switch 210. Now the power rectifier 306 is still forward-biased/conducting, the rectifier within the separator 208 is still conducting since being still forward-biased, the controllable commutating switch 210 is also conducting since being closed, and, with assumption that forward voltage drops across all them may be neglected, the most of the output voltage $V_{out}$ is therefore applied across the damp/resonant choke 216 ascribed with current $i_{216}(t)$ and with voltage $u_{216}(t)$ in FIG. 4(c).

The current $i_{216}(t)$ through the damp/resonant choke 216 starts increasing at the rate of:

$$di_{216}/dt = -V_{out}/L_{216} \qquad [5]$$

where: $L_{216}$ is an inductance value of the damp/resonant choke 216.

The rate of current $i_{216}(t)$ increase defines the rate of simultaneous decrease both of the current $i_{306}(t)$ carried by power rectifier 306, as shown in FIG. 4(d), and of the current $i_{214}(t)$ carried by the rectifier within the fourth commutator 214, as shown in FIG. 4(g), thus resulting in dissipation of excessive carriers within their bases. Therefore the damp/resonant choke 216 performs a damping function while defining the rate of dissipation of excessive carriers within the bases of the power rectifier 306 and of the rectifier within the fourth commutator 214.

With proper choice of damp/resonant choke 216 inductance value $L_{216}$, it is possible to decrease the power losses associated with switching into reverse-biased/non-conducting state both the power rectifier 306 and the rectifier within the fourth commutator 214.

As far as the current $i_{214}(t)$ is substantially less than the current $i_{306}(t)$ then excessive carriers within the base of the rectifier within fourth commutator 214 fully dissipate very soon and at the time $t_{0.1}$, as shown in FIG. 4(g), the rectifier within the fourth commutator 214 fully recovers its initial reverse resistance, i.e. much prior to time $t_2$ at which the power rectifier 306 reaches the same state.

The currents $i_{216}(t)$ and $i_{316}(t)$ would proceed undergoing each own way according to [5] well past time $t_1$ when the current $i_{306}(t)$ falls down to zero, i.e. $i_{306(t1)}=0$, as shown in FIG. 4(d).

At time $t_1$ the excessive carriers dissipation within the base of the power rectifier 306 is over and its reverse recovery starts. Within the interval between time $t_1$ and time $t_2$ the power rectifier 306 carries reverse recovery current.

At time $t_2$ the power rectifier 306 becomes reverse-biased/non-conducting and disconnects the load 309 off the primary power source 308. Since prior to time $t_2$ the power rectifier 306 has been conducting, the voltage $u_{304}(t)$ across the controllable power switch 304 and across the capacitor within the first slope-shaper 217 is still very close to $V_{out}$ level.

Past time $t_2$ the on-going process is defined by the LC resonant tank consisting of parallel-connected damp/resonant choke 216 and of the capacitor within the first slope-shaper 217. The rectifier within the separator 208 is still forward-biased/conducting, the controllable commutating switch 210 is still closed/conducting, and both these pay no influence upon the process flow.

The current $i_{216}(t)$, as shown in FIG. 4(c), still proceeds increasing which results in decrease of the voltage $u_{304}(t)$ applied across the capacitor within the first slope-shaper 217 and across the boost switch 304:

$$i_{216}(t)=i_{305}(t_0)+i_{306}(t_2)-C_{217}du_{217}/dt, \quad [6]$$

where: $u_{217}(t)=u_{304}(t)=L_{216}di_{216}/dt$, $i_{305}(t_0)$ is the value of current carried by boost inductor 305 at the time $t_0$, $i_{306}(t_2)$ is the value of current carried by boost rectifier 306 at the time $t_2$ of its turn-off/non-conducting, Respecting the component parameters of the active soft-switching conditioner 202 the equation [6] may be performed as:

$$i_{216}(t)=i_{305}(t_0)+i_{306}(t_2)-V_{out}\sin\omega_0 t/(L_{216}/C_{217})^{0.5}, \quad [7]$$

$u_{217}(t)=V_{out}\sin\omega_0 t$, where:

$$\omega_0=(L_{216}C_{217})^{-0.5}$$

is a natural resonant frequency of the tank consisting of the damp/resonant choke 216 coupled to the capacitor within the first slope-shaper 217, $C_{217}$ is the value of the capacitor within the first slope-shaper 217.

The sine wave forms of the current through the damp/resonant choke 216 and of the voltage across the capacitor within the first slope-shaper 217 would last until time $t_3$, when the voltage $u_{217}t)=u_{304}(t)$ across this capacitor and across the controllable power switch 304, as shown in FIG. 4(e), reaches close to zero and the rectifier within the second commutator 212 becomes forward-biased/conducting.

Therefore within the interval between time $t_2$ and time $t_3$ the damp/resonant choke 216 performs a resonant inductor function within the $L_{216}C_{217}$ resonant tank. Within this interval the sinusoidal fashion of discharging the capacitor within the first slope-shaper 217 is provided as preparation for switching the controllable power switch 304 into closed/conducting state under zero-voltage-across condition at time $t_4$.

At time $t_3$ the damp/resonant choke 216 is shunt-shortened by the network consisting of closed/conducting controllable commutating switch 210 and of two now being parallel-connected rectifiers: the first one incorporated within the separator 208 and the second one incorporated within the second commutator 212.

Past time $t_3$ the current $i_{216}(t)$ of the damp/resonant choke 216 is summarily composed by the current $i_{208}(t)$, as shown in FIG. 4(i), carried by the separator 208 and by the current $i_{212}t$, as shown in FIG. 4(j), carried by the second commutator 212.

Since the time-constant of the locked loop consisting of structures 208, 210, 212, 216 is substantially large then the current $i_{216}(t)$ would sufficiently maintain its close to maximum value $I_{max216}$ within the interval between time $t_3$ and time $t_5$:

$$i_{216}(t_3)\approx i_{216}(t_4)\approx i_{216}(t_5)\approx I_{max216} \quad [8]$$

i.e. up to the controllable commutating switch 210 within the first commutator 209 is triggered into open/non-conducting state by the control pulse $u_{G209}t)$ shown in FIG. 4(a).

It is reasonable to decrease the duration of this state with aim to decrease the power losses within the structures 208, 210, 212, 216. Starting from time $t_3$ the controllable power switch 304 may be switched into closed/conducting state under zero-voltage-across conditions at any time before the controllable commutating switch 210 within the first commutator 209 is triggered into open/non-conducting state.

At time $t_4$ the control pulse $u_{g304}(t)$, as shown in FIG. 4(b), triggers the controllable power switch 304 into closed-conducting state.

Switching the controllable power switch 304 into closed/conducting state at time $t_4$, does not cause a current flow through it and does not change the process within the circuit. Thus the controllable power switch 304 is switched into closed/conducting state under zero-voltage-across and zero-current-through conditions simultaneously. These conditions last until time $t_5$ when the control pulse $u_{209G}(t)$ shown in FIG. 4(a) triggers the controllable commutating switch 210 into open/non-conducting state.

At time $t_5$ the capacitor within the second slope-shaper 218 is discharged close to zero. With its capacitance value proper choice the zero-voltage-across condition for controllable commutating switch 210 turn open/non-conducting is also provided to eliminate the switching losses within the first commutator 209.

Therefore, as shown in FIG. 4(f), at time $t_5$ both zero-current-through and zero-voltage-across conditions are provided for first commutator 209.

At time $t_5$ the rectifier 222 within the damp switch 215 becomes forward-biased/conducting, and the capacitor within the second slope-shaper 218 starts being resonantly charged by the current $i_{216}(t)$ The current flow through the damp switch 215 should be sensed by the control circuit of the DC-DC converter such that any non-zero forward current through the rectifier 222 within the damp switch 215 immediately results in producing the control pulse $u_{G215}(t)$ shown in FIG. 4(a) to trigger the controllable commutating switch 221 within the damp switch 215 into closed/conducting state, i.e. to catch the current flow through the damp switch 215.

Within the interval between time $t_5$ and time $t_6$ the capacitor within second slope-shaper 218 is resonantly charged, as shown in FIG. 4(m), through the forward-biased/conducting rectifier within the separator 208 and through the closed/conducting controllable commutating switch 221 within the damp switch 215.

At time $t_6$ the voltage across the capacitor within the second slope-shaper 218 reaches the level sufficient to forward-bias the rectifier within the third commutator 213 ascribed with current $i_{213}(t)$ and with voltage $u_{213}(t)$ in FIG. 4(k) into conducting state. Therefore the voltage across the capacitor within the second slope-shaper 218, as shown in FIG. 4(m), as well as across the first commutator 209, as shown in FIG. 4(f) is clamped at the level of DC-DC converter output voltage $V_{out}$.

Within the interval between time $t_6$ and time $t_7$ the energy magnetically stored within the damp/resonant choke 216 is forwarded to the load and the current $i_{216}(t)$ through the damp/resonant choke 216 (e.g. current $i_{215}(t)$ through the damp switch 215) linearly decreases to zero, as shown in FIG. 4 (c), while being sensed by the control circuit of the DC-DC converter to monitor the controllable commutating switch 221.

Within the interval between time $t_5$ and time $t_7$ the current $i_{215}(t)$ through the damp switch 215 is summarily composed by the current $i_{221}(t)$ through the controllable commutating switch 221 and by the current $i_{222}(t)$ through, the rectifier 222, i.e.:

$$i_{215}(t)=i_{221}(t)+i_{222}(t) \quad [9]$$

Within the interval between time $t_6$ and time $t_7$ the current $i_{215}(t)$ through the damp switch 215 linearly decreases to zero. As far as while being closed/conducting the controllable commutating switch 221 is of substantially less resistance than the rectifier 222, the current $i_{221}(t)$ through the controllable commutating switch 221 is substantially greater than the current $i_{222}(t)$ through the rectifier 222. With summary current $i_{215}(t)$ through the damp switch 215 decrease to zero the current $i_{222}(t)$ through the rectifier 222 reaches zero very soon past time $t_6$, as shown in FIG. 4(h), and by the time $t_7$ the rectifier 222 fully recovers its reverse resistance.

At time $t_7$ the control pulse $u_{G215}(t)$, as shown in FIG. 4(a), triggers the controllable switch 221 within the damp switch 215 into opened/non-conducting state.

At time $t_7$ the amount of energy magnetically stored within the damp/resonant choke 216 is close to zero. The damp switch 215 and the separator 208 disconnect the capacitor within the second slope-shaper 218 off the damp/resonant choke 216. As a result of such a double disconnection aimed to cut the path of the current $i_{216}(t)$ through the damp/resonant choke 216, the further current oscillations with multiple circulation of energy between the damp/resonant choke 216 and the capacitor within the second slope-shaper 218 are prevented, therefore eliminating the associated power losses and radiated EMI, and improving the dynamic controllability of the converter and the power conversion process regulation quality.

Besides, the conduction losses within the closed/conducting controllable power switch 304 are also decreased since within the interval from time $t_3$ till time $t_7$ its current decreases due to shunting the controllable power switch 304 with a network of series-connected rectifiers within the separator 208 ascribed with current $i_{208}(t)$ shown in FIG. 4(i) and within the second commutator 212 ascribed with current $i_{212}(t)$ shown in FIG. 4(j). Reverse-biasing the rectifiers 213, 222 under zero-current-through condition also decreases the total amount of losses.

Within the interval between time $t_7$ and time $t_8$ the rectifier within the separator 208 recovers its reverse resistance, as shown in FIG. 4(i). The reverse recovery current carried by the rectifier within the separator 208 is not substantial thus producing insubstantial amount of energy magnetically stored within the damp/resonant choke 216.

Nevertheless, at time $t_8$ when the rectifier within the separator 208 fully recovers its reverse resistance, the damp/resonant choke 216 produces a voltage pike, as shown in FIG. 4(c) enough sufficient to forward-bias both the rectifier 211 within the first commutator 209 and the rectifier within the fourth commutator 214 into conducting state, as shown in FIG. 4(g).

Through these forward-bias/conducting rectifiers the energy magnetically stored within the damp/resonant choke 216 is forwarded to the load 309, and the voltage across the damp/resonant choke 216 is clamped at the level of DC-DC converter output voltage $V_{out}$.

Within the interval between time $t_8$ and time $t_9$ the switching transition flow-chart active shaper 202 maintains the steady state of electric processes within its network, i.e. its components are current-free, the voltage across first slope-shaper 217 is close to zero, the voltage across second slope-shaper 218 is close to the DC-DC converter output voltage $V_{out}$.

As far as within the interval between time $t_4$ and time $t_9$ the power storage inductor 305 is coupled to the primary power source 308 through the closed/conducting controllable power switch 304, the power storage inductor 305 magnetically accumulates the power absorbed from the primary power source 308.

At time $t_9$ the control pulse $u_{G304}(t)$, as shown in FIG. 4(b), triggers the controllable power switch 304 into open/non-conducting state, and power accumulation cycle through the controllable power switch 304 within the power storage inductor 305 is over. The current $i_{305}(t)$, as shown in FIG. 4(d), maintained by the power storage inductor 305 now starts following the path through the network consisting of first slope-shaper 217, of second slope-shaper 218 and of third commutator 213. The capacitor within first slope-shaper 217 starts charging, as shown with current $i_{217}(t)$ and with voltage $u_{217}(t)$ in FIG. 4(l). The capacitor within the second slope-shaper 218 starts discharging, as shown with current $i_{218}(t)$ and with voltage $u_{218}(t)$ in FIG. 4(m), forwarding its statically stored energy to the output smoothing filter 307 and to load 309.

The duration of the interval between time $t_9$ and time $t_{10}$ depends on the values of the capacitors within the slope-shapers 217, 218 and should be chosen such to provide the zero-voltage-across condition for the controllable power switch 304.

At time $t_{10}$ the power rectifier 306, the rectifier within the separator 208 and the rectifier within the fourth commutator 214 become forward-biased/conducting thus providing the power path from the primary power source 308 and from the power storage inductor 305 to the output smoothing filter 307 and to the load 309.

Further the operation cycle restarts.

With a active soft-switching conditioner 201 shown in FIG. 2(a) being incorporated into conventional boost converter like shown in FIG. 3(a) its operation is as follows.

Within the interval between time $t_0$ and time $t_7$ both operation procedures and electric processes within the circuit occur similarly to those described above in concern to active soft-switching conditioner 202. Distinction appears at time $t_7$.

Because of non-zero time of excessive carriers dissipation within the base of the rectifier within third commutator 213 ascribed with current $i_{213}(t)$ and with voltage $u_{213}(t)$ in FIG.

4(n) and within the base of the rectifier within the damp switch 215 ascribed with current $i_{215}(t)$ and with voltage $u_{215}(t)$ in FIG. 4(o) both these rectifiers keep being conducting till time $t_{7.1}$ when their reverse resistance recovery is over.

Therefore, within the interval between time $t_7$ and time $t_{7.1}$ the damp/resonant choke 216 ascribed with current $i_{216}(t)$ and with voltage $u_{216}(t)$ in FIG. 4(p) magnetically accumulates the energy proportional to its current $i_{216}(t_{7.1})$.

Such an accumulation causes parasitic circulation of energy between the damp/resonant choke 216 and residual capacitance within the circuit till time $t_{7.2}$.

Further both operation procedures and electric processes within the circuit occur similarly to those described above in concern to active soft-switching conditioner 202.

With a active soft-switching conditioner 204 shown in FIG. 2(d) being incorporated into conventional boost converter its operation is as follows.

In the quasi-steady state prior to time $t_0$ the controllable power switch 304 ascribed with current $i_{304}(t)$ and with voltage $u_{304}(t)$ in FIG. 5(e) is opened/non-conducting, the power rectifier 306 ascribed with current $i_{306}(t)$ in FIG. 5(d) is forward-biased/conducting thus providing the power path from the primary power source 308 and from the power storage inductor 305 ascribed as current $i_{305}(t)$ in FIG. (d) to the load 309.

The components of the active soft-switching conditioner 204 are current-free: the controllable commutating switches 210, 219, 221 are open/non-conducting, the capacitor within the first slope-shaper 217 ascribed with current $i_{217}t)$ and with voltage $u_{217}(t)$ in FIG. 5(l) is charged to output voltage level $V_{out}$ the capacitors 223, 224 within the second slope-shaper 218 ascribed with current $i_{218}(t)$ and with voltage $u_{218}(t)$ in FIG. 5(m) are charged to voltage level "$V_{out}-V_{in}$" as referred to common junction point of the capacitors 223, 224.

The controllable commutating switch 210 within the first commutator 209 and the controllable commutating switch 219 within the second commutator 214 both are simultaneously operated in a synchronous/syn-phase fashion in accordance with control pulse $u_{G206}(t)$ shown in FIG. 5(a) and with control pulse $u_{G214}(t)$ shown in FIG. 5(b) respectively. The order of their on/off-turns is the same as above described of the controllable commutating switch 210 within the first commutator 209 within the active soft-switching conditioner 202.

The order of operating the controllable commutating switch 221 within the damp switch 215 with a control pulse $u_{G215}(t)$ shown in FIG. 5(a) is the same as above shown in FIG. 4(a) and as therewith described.

The order of operating the controllable power switch 304 with a control pulse $u_{G304}(t)$ shown in FIG. 5(b) is the same as above shown in FIG. 4(b) and as therewith described.

At time $t_0$ both the control pulse $u_{G209}(t)$, as shown in FIG. 5(a), and control pulse $u_{G214}(t)$, as shown in FIG. 5(b), trigger both the controllable commutating switch 210 within the first commutator 209 and the controllable commutating switch 219 within the second commutator 214 into closed/conducting state. The rectifier within the separator 208 becomes forward-biased/conducting. Therefore damp/resonant choke 216 is parallel-connected across the controllable power switch 304 through the structures 208, 210, 219. The output voltage $V_{out}$ is applied to the network of series-connected power rectifier 306, separator 208, damp/resonant choke 216 and controllable commutating switch 210. Now the power rectifier 306 is still forward-biased/conducting, the rectifier within the separator 208 is still conducting since being still forward-biased, the controllable commutating switches 210, 219 are also conducting since being closed, and, with assumption that forward voltage drops across all them may be neglected, the most of the output voltage $V_{out}$ is therefore applied across the damp/resonant choke 216 ascribed with current $i_{216}(t)$ and with voltage $u_{216}(t)$ in FIG. 5(c).

The current $i_{216}(t)$ through the damp/resonant choke 216 starts increasing according to [5].

The rate of current $i_{216}(t)$ increase defines the rate of simultaneous decrease of the current $i_{306}(t)$ carried by power rectifier 306, as shown in FIG. 5(d), thus resulting in dissipation of excessive carriers within its base. The currents $i_{216}(t)$ and $i_{306}(t)$ would proceed undergoing each own way according to [5] well past time $t_1$ when the current $i_{306}(t)$ falls down to zero, i.e. $i_{306(t1)}=0$, as shown in FIG. 5(d).

At time $t_1$ the excessive carriers dissipation within the base of the power rectifier 306 is over and its reverse recovery starts.

Within the interval between time $t_1$ and time $t_2$ the power rectifier 306 carries reverse recovery current.

At time $t_2$ the power rectifier 306 becomes reverse-biased/non-conducting and disconnects the load 309 off the primary power source 308.

Since prior to time $t_2$ the power rectifier 306 has been conducting, the voltage $u_{304}(t)$ across the controllable power switch 304 and across the capacitor within the first slope-shaper 217 is still very close to $V_{out}$ level.

Past time $t_2$ the on-going process is defined by the LC resonant tank consisting of parallel-connected damp/resonant choke 216 and of the capacitor within the first slope-shaper 217.

The rectifier within the separator 208 is still forward-biased/conducting, the controllable commutating switches 210, 219 are still closed/conducting, and all these pay no influence upon the process flow.

The current $i_{216}(t)$, as shown in FIG. 4(c), still proceeds increasing which results in decrease of the voltage $u_{217}(t)=u_{304}(t)$ applied across the capacitor within the first slope-shaper 217 and across the controllable power switch 304 in a sinusoidal fashion according to [5] and [6].

At time $t_{2.1}$ the voltage $u_{217}(t)=u_{304}(t)$ reaches the level close to "$V_{out}-V_{in}$", i.e. becomes equal to the voltage across the capacitors 223, 224 within the second slope-shaper 218. With voltage $u_{217}(t)=u_{304}(t)$ further decrease the rectifier 222 within the damp switch 215 becomes forward-biased/conducting.

The current flow through the damp switch 215 should be sensed by the control circuit of the DC-DC converter such that any non-zero forward current through the rectifier 222 within the damp switch 215 immediately results in producing the control pulse $u_{G215}(t)$ shown in FIG. 5(a) to trigger the controllable commutating switch 221 within the damp switch 215 into closed/conducting state, i.e. to catch the current flow through the damp switch 215.

As a result the capacitors 223, 224 within the second slope-shaper 218 become parallel-connected both to the capacitor within the second slope-shaper 217 through the forward-biased/conducting rectifier within the separator 208 and through closed/conducting controllable commutating switches 210, 219, 221. Hence the resonant LC tank is attributed with three parallel-connected capacitance and with inductance of damp/resonant choke 216.

The further events within the resonant LC tank would follow according to equation [6], [7] with summary capacitance, i.e.:

$$C_\Sigma = C_{217} + C_{223} + C_{224}, \qquad [10]$$

where:
- $C_\Sigma$ is a summary attributive capacitance of the resonant LC tank,
- $C_{217}$ is a capacitance value of the capacitor within the first slope-shaper 217,
- $C_{223}$ is a capacitance value of the capacitor 223,
- $C_{224}$ is a capacitance value of the capacitor 224, taken into account.

The sine wave forms of the current through the damp/resonant choke 216 and of the voltage across the capacitor within the first slope-shaper 217 would last until time $t_3$, when the voltage $u_{217}(t)=u_{304}(t)$ across this capacitor and across the controllable power switch 304, as shown in FIG. 5(e), reaches close to zero and the rectifier within the second commutator 212 becomes forward-biased/conducting.

Therefore within the interval between time $t_{2.1}$ and time $t_3$ the damp/resonant choke 216 performs a resonant inductor function within the $L_{216}C_\Sigma$ resonant tank. Within this interval the sinusoidal fashion of discharging the capacitors connected across the controllable power switch 304, i.e. sinusoidal fashion of decreasing the voltage across it, is provided as preparation for switching the controllable power switch 304 into closed/conducting state under zero-voltage-across condition at time $t_4$.

At time $t_3$ the damp/resonant choke 216 is shunt-shortened by the network consisting of closed/conducting controllable commutating switches 210, 219 and of two now being parallel-connected forward-biased/conducting rectifiers: the first one incorporated within the separator 208 and the second one incorporated within the second commutator 212.

Past time $t_3$ the current $i_{216}(t)$ of the damp/resonant choke 216 is summarily composed by the current $i_{208}(t)$, as shown in FIG. 5(i), carried by the separator 208 and by the current $i_{212}(t)$, as shown in FIG. 5(j), carried by the second commutator 212.

Since the time-constant of the locked loop consisting of structures 208, 210, 212, 216, 219 is substantially large then the current $i_{216}(t)$ would sufficiently maintain its close to maximum value $I_{max216}$ within the interval between time $t_3$ and time $t_5$:

$$i_{216}(t_3) \approx i_{216}(t_4) \approx i_{216}(t_5) \approx I_{max216} \quad [8]$$

i.e. up to time $t_5$ when the controllable commutating switches 210, 219 are triggered into open/non-conducting state by the control pulses $u_{G209}(t)$, $u_{g214}(t)$ shown in FIG. 5(a, b).

It is reasonable to decrease the duration of this state with aim to decrease the power losses within the structures 208, 210, 212, 216, 219. Starting from time $t_3$ the controllable power switch 304 may be switched into closed/conducting state under zero-voltage-across condition at any time before the controllable commutating switches 210, 219 are triggered into open/non-conducting state.

At time $t_4$ the control pulse $u_{g304}(t)$, as shown in FIG. 5(b), triggers the controllable power switch 304 into closed-conducting state still under zero-voltage-across condition.

At time $t_4$ the closed-conducting controllable power switch 304 shunt-shortens the current path through the separator 208 thus rearranging the values of currents carried by structures 210, 212, 219.

The rectifier within separator 208 starts its reverse resistance recovery.

At time $t_5$ the capacitors 223, 224 within the second slope-shaper 218 are discharged close to zero. With their capacitance value proper choice the zero-voltage-across conditions for controllable commutating switches 210, 219 turn-off are also provided, as shown in FIG. 5(f, g), to eliminate the switching losses within the commutators 209, 214.

Therefore, as shown in FIG. 5(f, g), at time $t_5$ both zero-current-through and zero-voltage-across conditions are provided for commutators 209, 214.

At time $t_5$ the controllable commutating switches 210, 219 become open/non-conducting thus disconnecting the damp/resonant choke 216 off the controllable power switch 304, and the current $u_{216}(t)$ starts the path through the damp switch 215. The rectifier 222 within the damp switch 215 becomes forward-biased/conducting, and the capacitors 223, 224 within the second slope-shaper 218 start being resonantly charged by the current $i_{216}(t)$.

The current flow through the damp switch 215 should be sensed by the control circuit of the DC-DC converter such that any non-zero forward current through the rectifier 222 within the damp switch 215 immediately results in producing the control pulse $u_{G215}(t)$ shown in FIG. 5(a) to trigger the controllable commutating switch 221 within the damp switch 215 into closed/conducting state, i.e. to catch the current flow-through through the damp switch 215.

The capacitor 223 may be omitted off the second slope-shaper 218 except of the case when the necessary time of the developed voltage-slope increase from zero-level to maximum should exceed the time of excessive carriers dissipation within the base of the rectifier within the separator 208 and of its reverse resistance recovery.

The capacitor 224 additionally performs a damping function by smoothing the voltage pikes across the damp/resonant choke 216, decreasing the reverse recovery time of the rectifier within the separator 208, thus decreasing the losses resulted from magnetically stored energy circulation within the circuit.

Within interval between time $t_5$ and time $t_6$ the capacitors 223,224 within the second slope-shaper 218 are resonantly charged, as shown in FIG. 5(m), through the forward-biased rectifier within the second commutator 212 and through the closed/conducting controllable power switch 304.

At time $t_6$ the voltage across the capacitors 223, 224 within the second slope-shaper 218 reaches the level sufficient to forward-bias the rectifier within the third commutator 213 ascribed with current $i_{213}(t)$ and with voltage $u_{213}(t)$ in FIG. 5(k) into conducting state. Therefore the voltage across the capacitors 223, 224, as shown in FIG. 5(m), is clamped at the level of the primary power source 308 voltage $V_{in}$.

Within the interval between time $t_6$ and time $t_7$ the energy stored within the damp/resonant choke 216 is forwarded to the primary power source 308 and the current $i_{216}(t)$ through the damp/resonant choke 216, as shown in FIG. 5 (c), e.g. current $i_{215}(t)$ through the damp switch 215, as shown in FIG. 5 (h),) linearly decreases to zero while being sensed by the control circuit of the DC-DC converter to monitor the controllable commutating switch 221.

Within the interval between time $t_5$ and time $t_7$ the current $i_{215}(t)$ through the damp switch 215 is summarily composed by the current $i_{222}(t)$ through the controllable commutating switch 221 and by the current $i_{222}(t)$ through the rectifier 222 according to [9].

Within the interval between time $t_6$ and time $t_7$ the current $i_{215}(t)$ through the damp switch 215 linearly decreases to zero. As far as while being closed/conducting the controllable commutating switch 221 is of substantially less resistance than the rectifier 222, the current $i_{221}(t)$ through the controllable commutating switch 221 is substantially greater than the current $i_{222}(t)$ through the rectifier 222. With summary current $i_{215}(t)$ through the damp switch 215 decrease to zero the current $i_{222}(t)$ through the rectifier 222 reaches zero very soon past time $t_6$, as shown in FIG. 5(h), and by the time $t_7$ the rectifier 222 filly recovers its reverse resistance.

At time $t_7$ the control pulse $u_{G215}(t)$, as shown in FIG. 5(a), triggers the controllable commutating switch 221 within the damp switch 215 into open/non-conducting state.

At time $t_7$ the amount of energy magnetically stored within the damp/resonant choke 216 is close to zero.

Within the interval between time $t_7$ and time $t_8$ the rectifier within the second commutator 212 recovers its reverse resistance, as shown in FIG. 5(j). The reverse recovery current carried by the rectifier within the second commutator 212 is not substantial thus producing insubstantial amount of energy magnetically stored within the damp/resonant choke 216.

Nevertheless, at time $t_8$ when the rectifier within the second commutator 212 fully recovers its reverse resistance, the damp/resonant choke 216 produces a voltage pike, as shown in FIG. 5(c) enough sufficient to forward-bias the rectifier 211 within the first commutator 209 and the rectifier 220 within the fourth commutator 214 into conducting state. Through these forward-biased/conducting rectifiers and through the capacitor 224 the energy magnetically stored within the damp/resonant choke 216 is forwarded to the primary power source 308. The capacitor 224 while damping the voltage spike across the damp/resonant choke 216 also forwards a part of its statically stored charge to the primary power source 308.

Within the interval between time $t_8$ and time $t_9$ the switching transition flow-chart active shaper 204 maintains the steady state of electric processes within its network, i.e. its components are current-free, the voltage across first slope-shaper 217 is close to zero, the voltage across the capacitor 223 is close to the level of the primary power source 308 voltage $V_{in}$, the voltage across the capacitor 224 is less than $V_{in}$ proportionally to the amount of magnetically stored energy within the damp/resonant choke 216 at time $t_8$.

As far as within the interval between time $t_4$ and time $t_9$ the power storage inductor 305 is coupled to the primary power source 308 through the forward-biased/conducting controllable power switch 304, the power inductor 305 magnetically accumulates the power absorbed from the primary power source 308.

At time $t_9$ the control pulse $u_{G304}(t)$, as shown in FIG. 5(b), triggers the controllable power switch 304 into open/non-conducting state, and power accumulation cycle through the controllable power switch 304 within the power storage inductor 305 is over. The current $i_{305}t)$, as shown in FIG. 5(d), maintained by the power storage inductor 305 now starts following the path through the network consisting of first slope-shaper 217, of the capacitor 223 within the second slope-shaper 218 and of third commutator 213. The capacitor within the first slope-shaper 217 starts charging, as shown with current $i_{217}(t)$ and with voltage $u_{217}(t)$ in FIG. 5(l), up to the level $V_{out}$. The capacitor 223 within the second slope-shaper 218 starts discharging, as shown with current $i_{218}(t)$ and with voltage $u_{218}(t)$ in FIG. 5(m), forwarding its statically stored energy to the primary power source 308. When the voltage across the capacitor 223 becomes equal to the voltage across the capacitor 224 the rectifier within the separator 208 becomes forward-biased/conducting, and the capacitor 224 also starts forwarding its statically stored energy to the primary power source 308.

The duration of the interval between time $t_9$ and time $t_{10}$ depends on the values of the capacitors within the slope-shapers 217, 218 and should be chosen such to provide the zero-voltage-across condition for the controllable power switch 304.

At time $t_{10}$ the power rectifier 306, the rectifier within the separator 208 and the rectifier within the fourth commutator 214 become forward-biased/conducting thus providing the power path from the primary power source 308 and from the power storage inductor 305 to the output smoothing filter 307 and to the load 309.

Further the operation cycle restarts.

With an active soft-switching conditioner 203 shown in FIG. 2(c) being incorporated into conventional boost converter like shown in FIGS. 3(b, c) its operation is as follows.

Within the interval between time $t_0$ and time $t_7$ both operation procedures and electric processes within the circuit occur similarly to those described above in concern to active soft-switching conditioner 204. Distinction appears at time $t_7$.

Because of non-zero time of excessive carriers dissipation within the base of the rectifier within third commutator 213 ascribed with current $i_{213}(t)$ and with voltage $u_{213}(t)$ in FIG. 5(n) and within the base of the rectifier within the damp switch 215 ascribed with current $i_{215}(t)$ and with voltage $u_{215}(t)$ in FIG. 5(o) both these rectifiers keep being conducting till time $t_{7.1}$ when their reverse resistance recovery is over.

Therefore, within the interval between time $t_7$ and time $t_{7.1}$ the damp/resonant choke 216 ascribed with current $i_{216}(t)$ and with voltage $u_{216}(t)$ in FIG. 5(p) magnetically accumulates the energy proportional to its current $i_{216}(t_{7.1})$.

Such an accumulation causes parasitic circulation of energy between the damp/resonant choke 216 and residual capacitance within the circuit till time $t_{7.2}$.

Further both operation procedures and electric processes within the circuit occur similarly to those described above in concern to active soft-switching conditioner 204.

The same as above description is sufficiently applicable to all embodiments of the proposed invention shown in FIG. 2.

Figure 6:
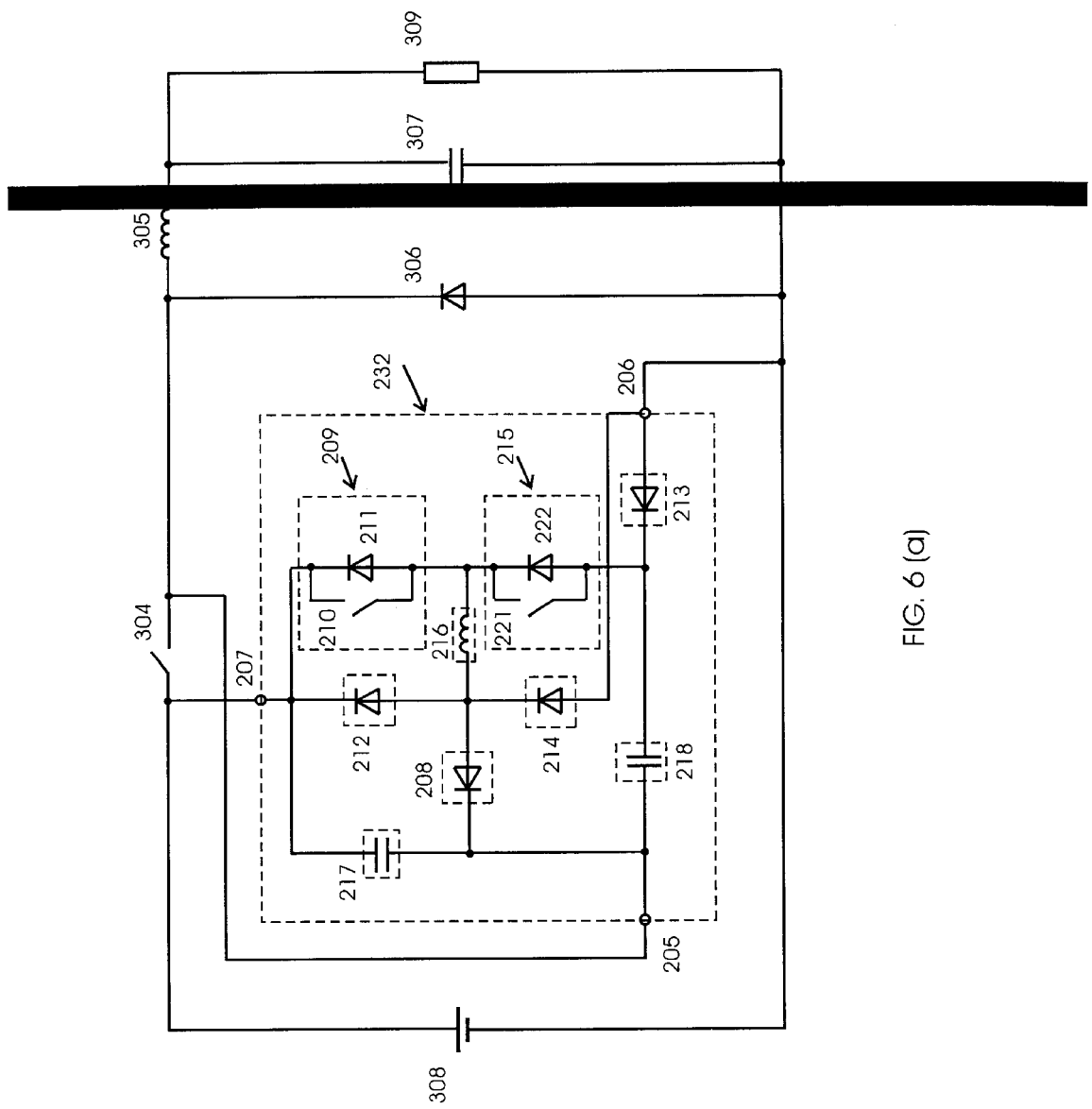
FIGS. 6 (a)–(f) illustrates the circuit diagrams of DC-DC power converters of various topologies comprising the various embodiments of active soft-switching conditioner according to the invention.
Figure 6:
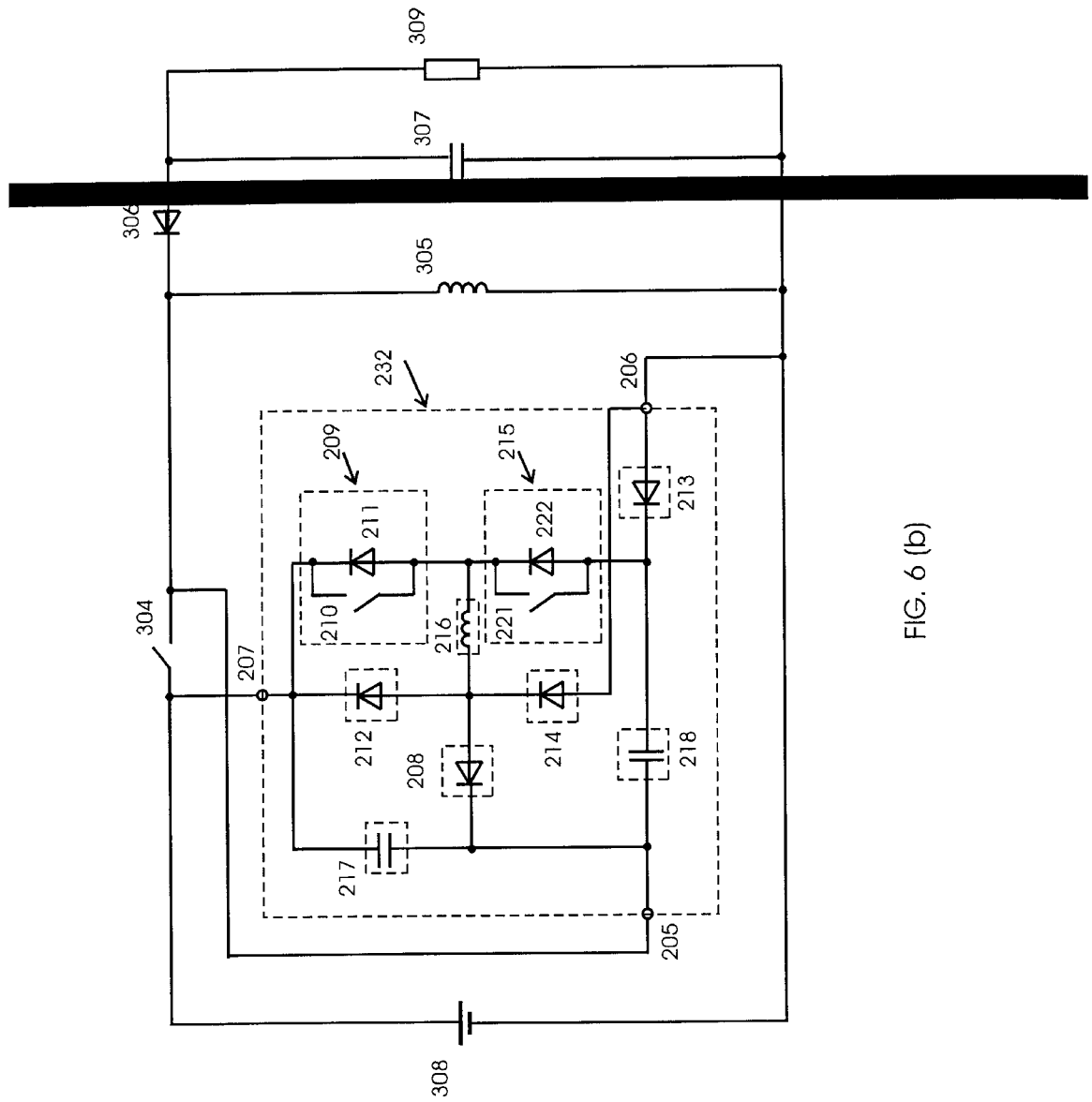
Figure 6C:
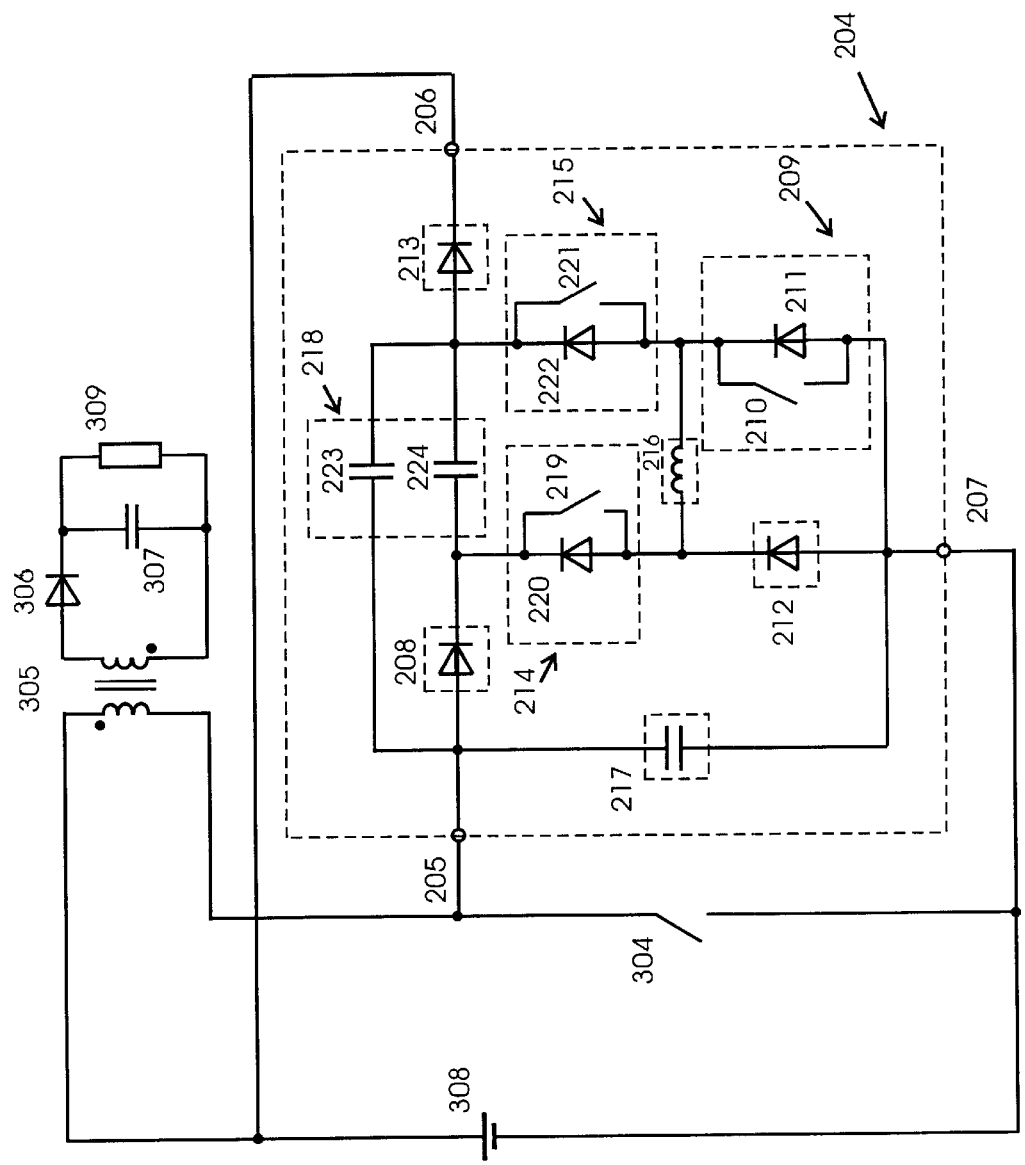
Figure 6D:
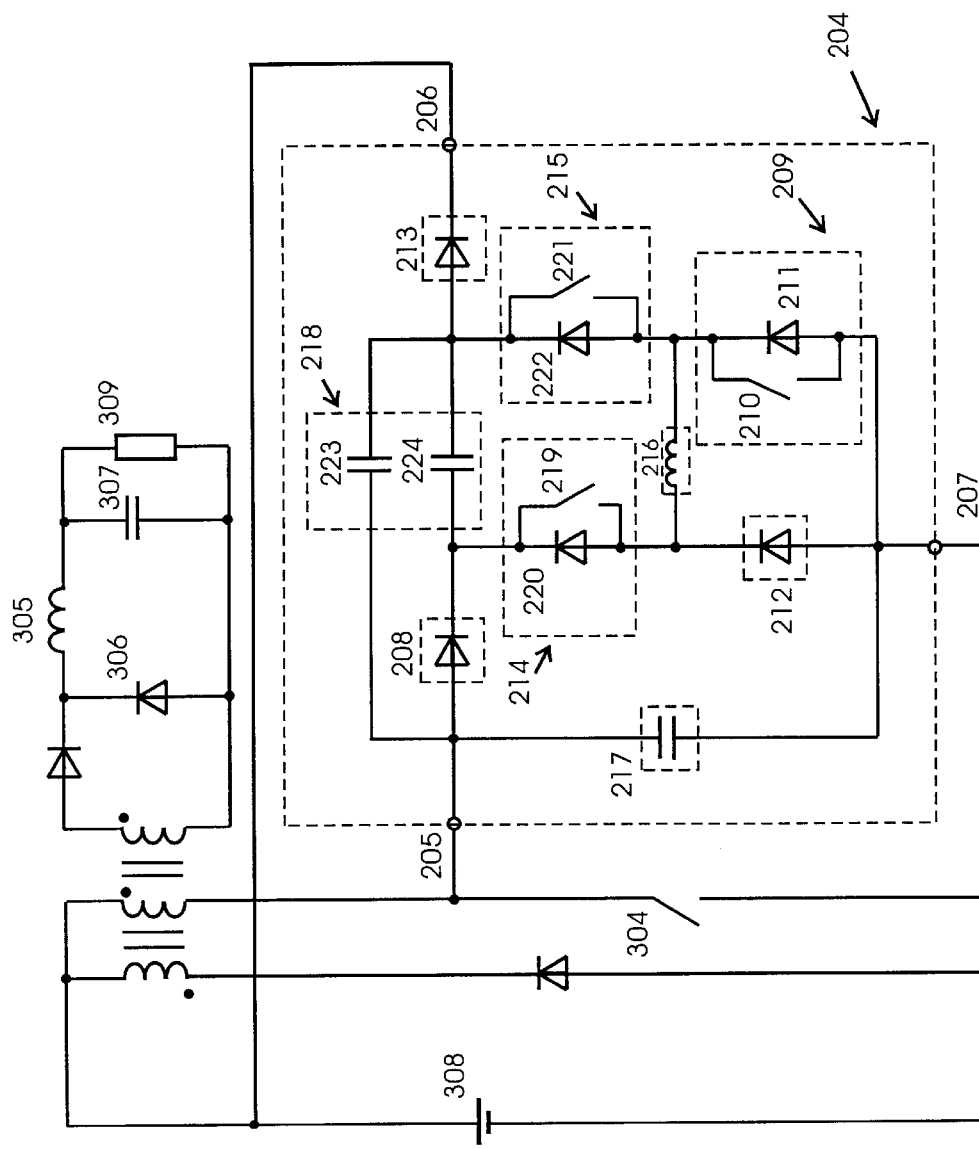
Figure 6E:
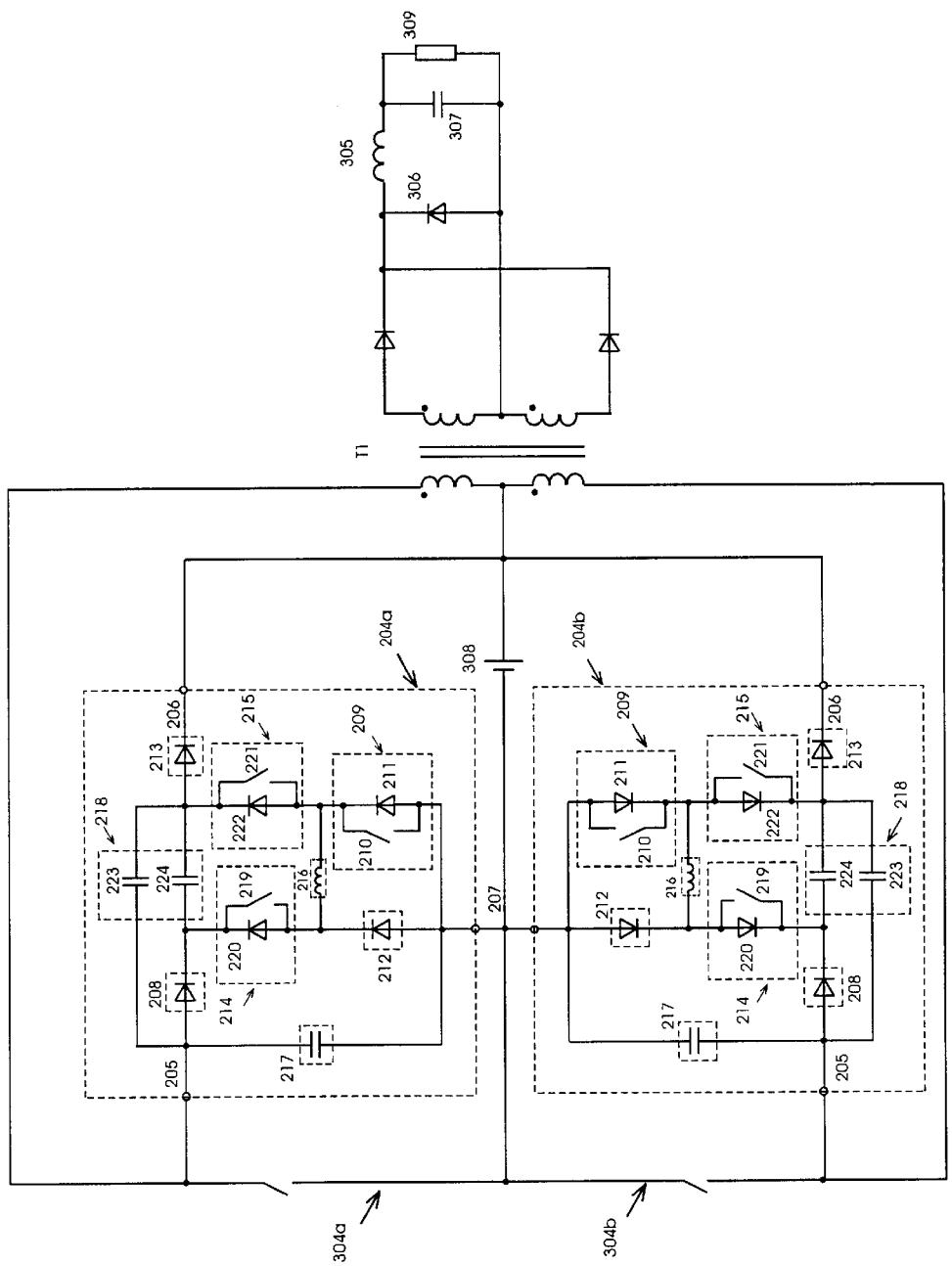
Figure 6:
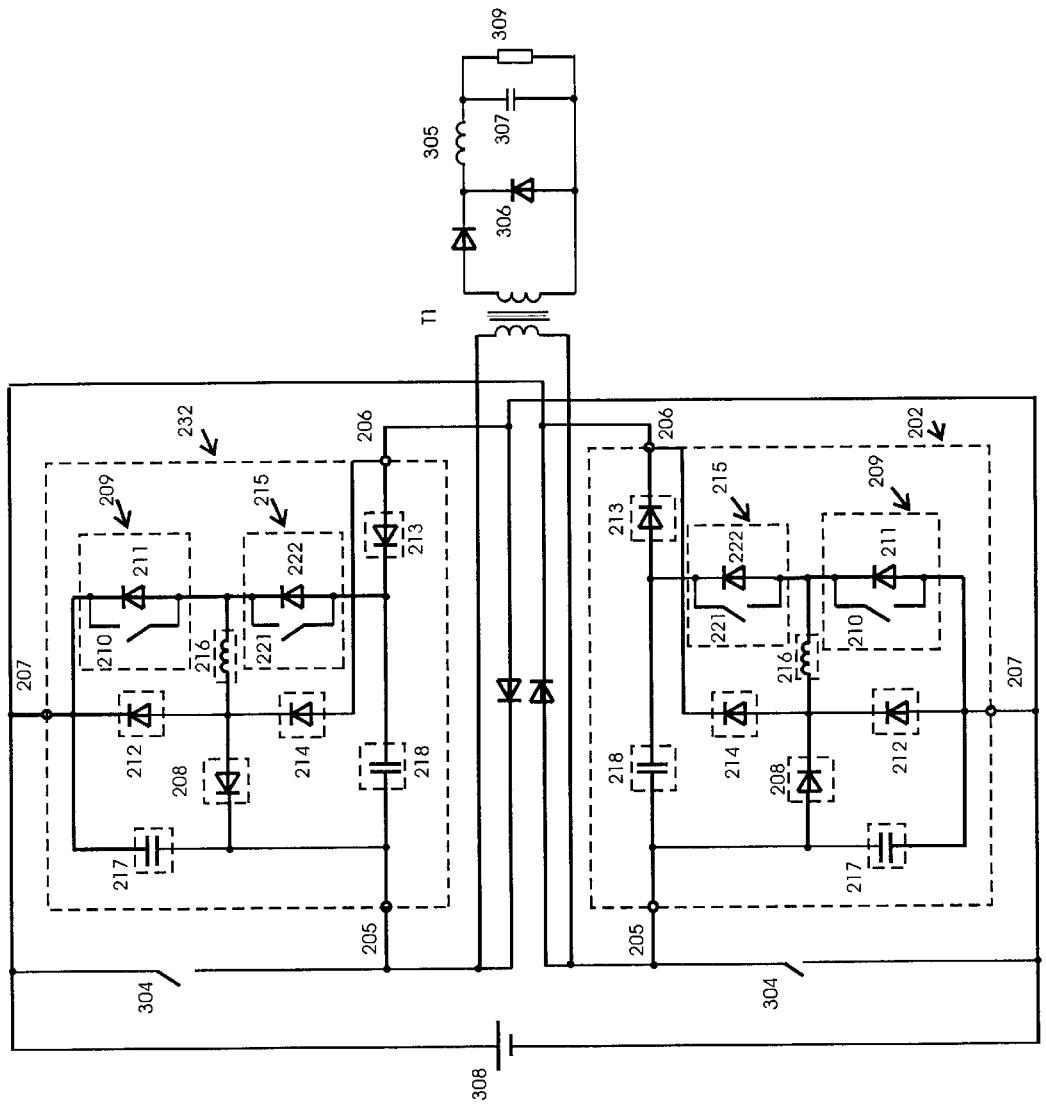

FIG. 6 illustrates the circuit diagrams of DC-DC power converters of various topologies comprising the various embodiments of the proposed invention.

In view of the above discussion of the active soft-switching conditioner it can be understood that implementing this circuit into a family of DC-DC power converters allows to obtain the lossless switching transitions both within the power switching devices and within the active soft-switching conditioner itself, to reduce the overall power loss and heat dissipation within the modified converters in comparison with those of the prior art, and to increase the power conversion operational frequency.

It should be also understood that, while limited embodiments only of the present invention have been disclosed herein above, all these embodiments are provided by an example only and not in a limiting sense. Various modifications and additions to the preferred embodiments can be made without departing from the spirit and the scope of the present invention.

It should be also understood that the patent protection sought and to be afforded hereby shall be deemed to extend to the subject matter claimed and all equivalence thereof fairly within the scope of the invention.

Unless defined otherwise, all technical and scientific terms used herein have the same meaning as commonly understood by one of ordinary skill in the art to which the present invention belongs. Although any methods and materials similar or equivalent to those described can be used in the practice or testing of the present invention, the preferred methods and materials are now described. All publications and patent documents referenced in the present invention are incorporated herein by reference.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, with the limits only of the true purview, spirit and scope of the invention.

We claim:

1. A family of switching type pulse-width-modulated DC-DC converters for converting the power from the primary power source to an output power draw defined by the load power consumption demands, said converters comprising:

an input means to be connected to said primary power source;

an output means to be connected to said load;

a common return bus to be connected between said primary power source and said load;

a power storage inductor to accumulate the power absorbed from said primary power source and to deliver said power to said load;

a controllable power switch operated in a pulse-width-modulated fashion and alternatively turned into conducting state to provide the power absorption from said primary power source into said power storage inductor and turned into non-conducting state to provide the power release from said power storage inductor into said load;

a power rectifier to disconnect said load from said power storage inductor and from said primary power source while said controllable power switch is conducting and to provide the power release path from said power storage inductor and from said primary power source to said load while said controllable power switch is non-conducting;

an output smoothing filter to store the power delivered to said load and to absorb the ripple component of delivered power;

an active soft-switching conditioner connected through its nodes across said controllable power switch to provide active shaping the operating points trajectories of the switching devices through active developing soft-switching zero-voltage-across/zero-current-through conditions within the time intervals of alternative changing between conducting and non-conducting states; said active soft-switching conditioner comprising:

an input node connected to the junction point common for said power storage inductor, for said power controllable switch and for said power rectifier;

an output node;

a common node connected to said common return bus;

a separator to separate the networks within said active soft-switching conditioner, said separator comprising at least a rectifier;

first commutator to provide first controllable path for currents within the network of said active soft-switching conditioner, said first commutator comprising a controllable switch connected in parallel with a rectifier;

second commutator to provide second controllable path for currents within the network of said active soft-switching conditioner, said second commutator comprising at least a rectifier;

third commutator to provide third controllable path for currents within the network of said active soft-switching conditioner, said third commutator comprising a rectifier;

fourth commutator to provide fourth controllable path for currents within the network of said active soft-switching conditioner, said fourth commutator comprising at least a rectifier;

first slope-shaper to provide shaping the voltage wave form developed across said controllable power switch during said controllable power switch transition into non-conducting state, therefore creating soft-switching zero-voltage-across condition for said controllable power switch during its transition into non-conducting state such that said controllable power switch transition into non-conducting state does not produce power loss, said first slope-shaper comprising at least a capacitor;

second slope-shaper to provide shaping the voltage wave form developed across said first commutator, therefore creating soft-switching zero-voltage-across/zero-current-through conditions during said first commutator transition into nonconducting state such that said first commutator transition into non-conducting state does not produce power loss, said second slope-shaper comprising at least one capacitor;

damp/resonant choke to provide the prescribed rate-of-change for the current through said power rectifier during its transition into non-conducting state, therefore creating soft-switching close to zero-current-through condition for said power rectifier during its transition into non-conducting state such that said power rectifier transition into non-conducting state does not produce power loss, and to provide the resonant discharge path for the capacitor within said first slope-shaper for shaping the voltage wave form developed across said controllable power switch during said controllable power switch transition into conducting state, therefore creating soft-switching zero-voltage-across/zero-current-through condition for said controllable power switch during its transition into conducting state such that said controllable power switch transition into conducting state does not produce power loss;

damp switch to provide a current path to release the energy magnetically stored within said damp/resonant choke, and to damp the parasitic circulation of energy magnetically stored within said damp/resonant choke, said damp switch comprising at least a rectifier; said first slope-shaper is connected between said input node and said common node to shunt said controllable power switch;

a series-connection network comprising said separator connected with said damp/resonant choke connected with said first commutator is parallel-connected across said first slope-shaper to shunt said controllable power switch;

a controllable switch within said first commutator is turned into conducting state prior to said controllable power switch transition into conducting state to provide the prescribed rate-of-change for the current through said power rectifier during its transition into non-conducting state, therefore creating soft-switching close to zero-current-through condition for said power rectifier during its transition into nonconducting state such that said power rectifier transition into non-conducting state does not produce power loss, and to provide the resonant discharge path for the capacitor within said first slope-shaper, therefore creating soft-switching zero-voltage-across/zero-current-through condition for said controllable power switch during its transition into conducting state such that said controllable power switch transition into conducting state does not produce power loss;

a series-connection network comprising said second slope-shaper connected with said damp switch is parallel-connected across said damp/resonant choke to shunt said damp/resonant choke and to provide the prescribed shape-of-change for the voltage across said first commutator during its transition into non-conducting state, therefore creating soft-switching zero-voltage-across/zero-current-through condition for said first commutator such that said first commutator transition into non-conducting state does not produce power loss;

a series-connection network comprising said third commutator connected with said second slope-shaper is adapted to limit the voltage level across said second slope-shaper during resonant release of energy magnetically stored within said damp/resonant choke;

a series-connection network comprising said third commutator connected with said second slope-shaper is adapted to provide a discharge path for the capacitor(s) within said second slope-shaper past said controllable power switch transition into nonconducting state; and a series-connection network comprising said third commutator connected with said second slope-shaper is coupled between said input node and said output node to provide the prescribed rate-of-change for the voltage across said controllable power switch during its transition into nonconducting state, therefore creating soft-switching zero-voltage-across condition for said controllable power witch such that said controllable power switch transition into non-conducting state does not produce power loss.

2. Converters according to claim 1, wherein said separator is connected between said input node and common junction point of said damp/resonant choke connected with said second commutator connected with said fourth commutator to damp the parasitic circulation of energy magnetically stored within said damp/resonant choke, and to limit the rate-of-change of current through said power rectifier during its transition into non-conducting state, therefore creating soft-switching close to zero-current-through condition for said power rectifier during its transition into non-conducting state such that said power rectifier transition into non-conducting state does not produce power loss, and to limit the rate-of-change of voltage developed across said controllable power switch during its transition into non-conducting state, therefore creating soft-switching zero voltage-across condition for said controllable power switch such that said controllable power switch transition into non-conducting state does not produce power loss.

3. Converters according to claim 2, wherein said damp switch comprises a controllable switch connected in parallel with a rectifier, and said controllable switch within said damp switch commutates the damp/resonant choke with magnetically stored energy release circuit such that said damp/resonant choke is disconnected from said magnetically stored energy release circuit as soon as the current through said damp/resonant choke reaches close to zero, therefore eliminating the parasitic circulation of energy magnetically stored within said damp/resonant choke.

4. Converters according to claim 3, wherein said fourth commutator comprises:

a controllable switch connected in parallel with a rectifier;

a series-connection network comprising said separator connected with said fourth commutator connected with said damp/resonant choke connected with said first commutator is parallel-connected across said first slope-shaper to shunt said controllable power switch, said controllable switch within said first commutator and said controllable switch within said fourth commutator both are simultaneously turned into conducting state prior to controllable power switch transition into conducting state to provide the prescribed rate-of-change for the current through said power rectifier during its transition into non-conducting state therefore creating soft-switching close to zero-current-through condition that said power rectifier transition into non-conducting state does not produce power loss, and to provide the resonant discharge path for the capacitor within said first slope-shaper, therefore creating soft-switching zero-voltage-across/zero-current-through condition for said controllable power switch during its transition into conducting state such that said controllable power switch transition into conducting state does not produce power loss;

said second slope-shaper comprises first capacitor and second capacitor, and said first capacitor has first terminal and second terminal, and said second capacitor has first terminal and second terminal, and aid first capacitor and said second capacitor are arranged in parallel such that:

said first terminal of said first capacitor makes first lead of said second slope-shaper, and said first terminal of said second capacitor makes second lead of said second slope-shaper, and said second terminal of said first capacitor and said second terminal of said second capacitor are connected in common junction which makes third lead of said second slope-shaper;

said first lead of said second slope-shaper is connected to the junction point common to said input node connected with said first slope shaper connected with said separator;

said second lead of said second slope-shaper is connected to the junction point common to said separator connected with said fourth commutator;

said third lead of said second slope shaper is connected to the junction point common to said damp switch connected with said third commutator;

a series-connection network comprising said second slope-shaper connected with said damp switch is parallel-connected across said damp/resonant choke connected at one side both with said second commutator and with said fourth commutator, and connected at other side with said first commutator, to shunt said damp/resonant choke and to provide the prescribed shape-of-change for the voltage across said first commutator as soon as its transition into non-conducting state starts and for the voltage across said fourth commutator as soon as its transition into nonconducting state starts, therefore creating soft-switching zero-voltage-across/zero-current-through conditions both for said first commutator transition into non-conducting state and for said fourth commutator transition into non-conducting state such that both said first commutator transition into non-conducting state and said fourth commutator transition into non-conducting state do not produce power losses;

said second commutator and series-connection network comprising said third commutator connected with said damp switch are adapted to provide a current path to release the energy magnetically stored within said damp/resonant choke and to damp the voltage pikes across the damp/resonant choke;

said second commutator and series-connection network comprising said third commutator connected with said second slope-shaper are adapted to limit the voltage level across said second slope-shaper during resonant charging said capacitor(s) within said second slope-shaper with magnetically stored energy being released from said damp/resonant choke;

said first commutator and a series-connection network comprising said fourth commutator connected with said second capacitor within said second slope-shaper through said second lead and with said third commutator are adapted to shunt said damp/resonant choke while damp/resonant choke releases the magnetically stored energy, therefore limiting voltage pikes across said damp/resonant choke;

a series-connection network comprising said second slope-shaper connected with said third commutator is coupled to said power storage inductor to provide the discharge path for said capacitors within said second slope-shaper past said controllable power switch transition into non-conducting state;

a series-connection network comprising said third commutator connected with said second slope-shaper is coupled between said input node and said output node to provide the prescribed rate-of-change for the voltage across said controllable power switch during its transition into non-conducting state, therefore creating soft-switching zero-voltage-across condition for said controllable power switch such that said controllable power switch transition into non-conducting state does not produce power loss.

5. Converters according to claim 4, wherein said output node is connected to the junction point common for said power rectifier and for said load to forward the released energy both from said damp/resonant choke and from said second slope-shaper to said load.

6. Converters according to claim 4, wherein said output node is connected to the junction point common for said primary power source and for said power storage inductor to forward the released energy both from said damp/resonant choke and from said second slope-shaper to said primary power source.

7. Converters according to claim 4, wherein said controllable power switch and all controllable switches within said damp switch, within said first commutator and within said fourth commutator are solid-state semiconductor switches.

8. Converters according to claim 7, wherein all rectifiers connected across said controllable switch within said damp switch, across said controllable switch within said first commutator and across said controllable switch within said fourth commutator are body diodes of said solid-state semiconductor switches.

9. Converters according to claim 4, wherein said capacitor within said first slope-shaper is a stray capacitor of said controllable power switch.

10. A method for converting the power from said primary power source to an output power draw defined by said load power consumption demands, in a family of switching type pulse-width-modulated DC-DC converters comprising:

an input means, an output means, a common return bus;

a power storage inductor, a controllable power switch, a power rectifier, an output smoothing filter, an active soft-switching conditioner connected through its nodes across the power switch, said active soft-switching conditioner comprising:

an input node, an output node, a common node;

a separator comprising at least a rectifier;

first commutator comprising a controllable switch connected in parallel with a rectifier;

second commutator comprising at least a rectifier;

third commutator comprising at least a rectifier;

fourth commutator comprising a controllable switch connected in parallel with a rectifier;

first slope-shaper comprising at least a capacitor;

second slope-shaper comprising at least one capacitor;

damp/resonant choke;

damp switch comprising a controllable switch connected in parallel with a rectifier;

said first slope-shaper is connected between said input node and said common node;

said separator is connected between said input node and common junction point of said damp/resonant choke connected with said second commutator connected with said fourth commutator to damp the parasitic circulation of energy magnetically stored within said damp/resonant choke, and to limit the rate-of-change of current through said power rectifier during its transition into non-conducting state, therefore creating soft-switching close to zero-current-through condition for said power rectifier such that said power rectifier transition into non-conducting state does not produce power loss, and to limit the rate-of-change of voltage developed across said controllable power switch during its transition into non-conducting state, therefore creating soft-switching zero-voltage-across condition for said controllable power switch such that said controllable power switch transition into non-conducting state does not produce power loss;

a series-connection network comprising said separator connected with said fourth commutator connected with said damp/resonant choke connected with said first commutator is parallel-connected across said first slope-shaper to shunt said controllable power switch;

said controllable switch within said first commutator and said controllable switch within said fourth commutator both are simultaneously turned into conducting state prior to controllable power switch transition into conducting state;

said second slope-shaper comprises first capacitor and second capacitor, and said first capacitor and said second capacitor are arranged in parallel such that:

first terminal of said first capacitor makes first lead of said second slope-shaper, and first terminal of said second capacitor makes second lead of said second slope-shaper, and second terminal of said first capacitor and second terminal of said second capacitor are connected in common junction which makes third lead of said second slope-shaper;

said first lead of said second slope-shaper is connected to the junction point common to said input node connected with said first slope-shaper connected with said separator;

said second lead of said second slope-shaper is connected to the junction point common to said separator connected with said fourth commutator;

said third lead of said second slope shaper is connected to the junction point common to said damp switch connected with said third commutator;

a series-connection network comprising said second slope-shaper connected with said damp switch is parallel-connected across said damp/resonant choke connected at one side both with said second commutator and with said fourth commutator, and connected at other side with said first commutator, to shunt said amp/resonant choke;

a series-connection network comprising said third commutator connected with said second slope-shaper is coupled between said input node and said output node to provide the prescribed rate-of-change for the voltage wave forms across said controllable power switch during its transition into non-conducting state, therefore creating soft-switching zero-voltage-across condition for said controllable power switch during its transition into non-conducting state such, that said controllable power switch transition into non-conducting state does not produce power loss;

said controllable switch within said damp switch commutates the damp/resonant choke with magnetically stored energy release circuit such that said damp/resonant choke is disconnected from said magnetically stored energy release circuit as soon as the current through said damp/resonant choke reaches close to zero, therefore eliminating the parasitic circulation of energy magnetically stored within said damp/resonant choke; to provide soft-switching zero-voltage-across/zero-current-through conditions both for power switching devices within said family of switching type pulse-width-modulated DC-DC converters and for networks commutating devices within said active soft-switching conditioner, and to eliminate power losses resulted from simultaneous overlapping non-zero-voltage-across/non-zero-current-through conditions during switching transitions within said power switching devices and within said networks commutating devices, and to provide an opportunity of power conversion operational frequency increase and hence the power storing components decrease in weight and size, and to improve the power conversion process regulation quality, and to reduce the radiated EMI, said method comprises the steps of:

turning simultaneously into conducting state both said controllable switch within said first commutator and said controllable switch within said fourth commutator prior to said controllable power switch transition into conducting state to provide the prescribed rate-of-change for the current through said power rectifier during its transition into non-conducting state, therefore creating soft-switching close to zero-current-through condition for said power rectifier such that said power rectifier transition into non-conducting state does not produce power loss, and to provide the resonant discharge path for the capacitor within said first slope-shaper, therefore creating soft-switching zero-voltage-across/zero-current-through condition for said controllable power switch such that said controllable power switch transition into conducting state does not produce power loss;

turning said power rectifier into non-conducting state with soft recovery of its reverse resistance under soft-switching close to zero-current-through condition hence losslessly disconnecting said load from said power storage inductor and from said primary power source;

connecting said power storage inductor to said primary power source for power absorption and accumulation through the networks within said active soft-switching conditioner;

turning said controllable power switch into conducting state under soft switching zero-voltage-across/zero-current-through conditions hence connecting said power storage inductor to said primary power source for power absorption and accumulation;

shunting said damp/resonant choke with a series-connection network comprising said second slope-shaper connected with said damp switch to provide the prescribed shape-of-change for the voltage across said first commutator as soon as its transition into non-conducting state starts and for the voltage across said fourth commutator as soon as its transition into non-conducting state starts, therefore creating soft-switching zero-voltage-across/zero-current-through conditions for said first commutator transition into non-conducting state and for said fourth commutator transition into non-conducting state such that said first commutator transition into non-conducting state and said fourth commutator transition into non-conducting state do not produce power losses;

releasing the energy magnetically stored within said damp/resonant choke through forward-biased said second commutator, through forward-biased said separator and through forward-biased said damp switch into said capacitors within said second slope-shaper and further into said output node as soon as past a prescribed time said third commutator becomes forward-biased/conducting;

turning said damp switch into non-conducting state as soon as its carried current decreases close to zero and soft-switching zero-current-through condition occurs, therefore eliminating the parasitic circulation of energy magnetically stored within said damp/resonant choke;

recovering said second commutator reverse resistance under soft-switching close to zero-current-through condition;

absorbing the power from said primary power source into said power storage inductor through said controllable power switch;

turning said controllable power switch into non-conducting state under soft-switching zero-voltage-across condition;

absorbing the power from said primary power source into said power storage inductor through linear charging said first slope-shaper and through linear discharging said second slope-shaper;

connecting said primary power source and said power storage inductor to said load as a result of said power rectifier transition into conducting state and forwarding the absorbed and accumulated power from said power storage inductor to said load and to said output smoothing filter.

11. Method according to claim 10, wherein said second slope-shaper is discharged through said third commutator into said primary power source to provide releasing the magnetically stored energy from said damp/resonant choke.

12. Method according to claim 10, wherein said second slope-shaper is discharged through said third commutator into said load to provide releasing the magnetically stored energy from said damp/resonant choke.

* * * * *